(12) United States Patent
Ma et al.

(10) Patent No.: US 12,619,525 B2
(45) Date of Patent: May 5, 2026

(54) MEMORY AND OPERATING METHOD THEREOF

(71) Applicant: GIGADEVICE SEMICONDUCTOR INC., Beijing (CN)

(72) Inventors: Sibo Ma, Beijing (CN); Hong Hu, Beijing (CN); Yang Li, Beijing (CN); Jianzhong Zhao, Beijing (CN)

(73) Assignee: GIGADEVICE SEMICONDUCTOR INC., Beijing (CN)

( * ) Notice: Subject to any disclaimer, the term of this patent is extended or adjusted under 35 U.S.C. 154(b) by 0 days.

(21) Appl. No.: 18/829,755

(22) Filed: Sep. 10, 2024

(65) Prior Publication Data

US 2025/0103478 A1     Mar. 27, 2025

(30) Foreign Application Priority Data

Sep. 25, 2023     (CN) .......................... 202311244994.7
Sep. 25, 2023     (CN) .......................... 202311246230.1

(51) Int. Cl.
| | |
|---|---|
| *G06F 12/00* | (2006.01) |
| *G06F 12/02* | (2006.01) |
| *G11C 7/10* | (2006.01) |
| *G11C 7/22* | (2006.01) |
| *G11C 8/06* | (2006.01) |
| *G11C 8/08* | (2006.01) |

(52) U.S. Cl.
CPC ........ *G06F 12/0223* (2013.01); *G11C 7/1069* (2013.01); *G11C 7/222* (2013.01); *G11C 8/06* (2013.01); *G11C 8/08* (2013.01)

(58) Field of Classification Search
CPC ............. G06F 12/0223; G06F 12/0207; G11C 7/1069; G11C 7/222; G11C 8/06; G11C 8/08; G11C 7/1018; G11C 7/1045
See application file for complete search history.

(56) References Cited

U.S. PATENT DOCUMENTS

| | | | | |
|---|---|---|---|---|
| 5,829,016 A * | 10/1998 | Sharma | ............... | G06F 13/1678 |
| | | | | 711/111 |
| 7,681,005 B1 * | 3/2010 | Mailloux | ................. | G11C 7/20 |
| | | | | 710/316 |
| 2004/0168016 A1 * | 8/2004 | Roohparvar | ............ | G06F 12/00 |
| | | | | 711/103 |

(Continued)

*Primary Examiner* — Arvind Talukdar
(74) *Attorney, Agent, or Firm* — IPro, PLLC

(57) ABSTRACT

Disclosed are a memory and operation method thereof. The memory comprises a memory array and an access interface for external access to the memory array, the access interface comprising at least one data/address multiplexing line. The method comprises: starting a specified random-column-access mode, in which the memory array can be continuously read or written in response to receiving multiple access addresses having a same row address and random column addresses; receiving a common row address and at least one column address via the data/address multiplexing line; outputting data read in response to the received access address via the data/address multiplexing line in the case where the mode indicates read operation, or receiving data to be written in response to the received access address via the data/address multiplexing line in the case where the mode indicates write operation; and ending the random column access mode by receiving an invalid chip-enable-signal.

20 Claims, 6 Drawing Sheets

Memory 100

(56)        References Cited

U.S. PATENT DOCUMENTS

| | | | | |
|---|---|---|---|---|
| 2004/0236898 A1* | 11/2004 | Okumura | ................. | G11C 8/04 |
| | | | | 711/167 |
| 2006/0190678 A1 | 8/2006 | Butler | | |
| 2007/0263458 A1* | 11/2007 | Ong | ......................... | G11C 8/06 |
| | | | | 365/189.02 |
| 2013/0238846 A1* | 9/2013 | Pekny | ................. | G06F 12/0246 |
| | | | | 711/103 |

* cited by examiner

Memory 100

CLK →

CE# →

A/DQ ↔

DQS/DM ↔

Access Interface 120

Command/ Address Decoder 130

Address Latch 150

Row/Column Decoder 180

Memory Array 110

Data Input/Output Module 140

Data Latch/Register 160

Sense Amplifier /Page Buffer 190

Burst Counter 170

MEMORY AND OPERATING METHOD THEREOF

CROSS-REFERENCE TO RELATED APPLICATIONS

This application claims priority to Chinese patent application No. 202311244994.7 filed on Sep. 25, 2023, the disclosure of which is incorporated herein by reference in its entirety and for all purposes.

TECHNICAL FIELD

The disclosure herein relates to the field of storage, and in particular to a memory and an operation method thereof.

BACKGROUND

Memory usually plays an important role in electronic devices such as computers. There are many different types of memories, including, such as, Static Random Access Memory (SRAM), Dynamic Random Access Memory (DRAM), Pseudo Static Random Access Memory (PSRAM), and flash memory. As the performance standards of electronic devices are getting higher, faster access to memory is often required.

Thus, it is desirable to improve the access speed of the memory.

SUMMARY

According to an embodiment of the present disclosure, a method for operating a memory is provided, the memory comprising a memory array and an access interface for external access to the memory array, the access interface comprising at least one data/address multiplexing line for transmitting data and address, the method comprising: starting a specified random column access mode, in which the memory array can be continuously read or written in response to receiving multiple access addresses, wherein the multiple access addresses have a same row address and random column addresses; receiving a common row address and at least one column address via the data/address multiplexing line; outputting data read in response to the received access address via the data/address multiplexing line in the case where the specified random column access mode indicates a read operation, or receiving data to be written in response to the received access address via the data/address multiplexing line in the case where the specified random column access mode indicates a write operation; and ending the random column access mode by receiving an invalid chip enable signal.

According to an embodiment of the present disclosure, a method for operating a memory is provided, the memory comprising a memory array and an access interface for external access to the memory array, the access interface comprising at least one data/address multiplexing line for transmitting data and address, the method comprises: starting a specified random row access mode, in which the memory array can be continuously read or written in response to receiving multiple access addresses, wherein the multiple access addresses have random row addresses and random column addresses; receiving at least two access addresses via the data/address multiplexing line, wherein each of the access addresses includes a row address and a column address; outputting data read in response to the received access addresses via the data/address multiplexing line in the case where the specified random row access mode indicates a read operation, or receiving data to be written in response to the received access addresses via the data/address multiplexing line in the case where the specified random row access mode indicates a write operation; and ending the random row access mode by receiving an invalid chip enable signal.

According to an embodiment of the present disclosure, a memory is provided, the memory comprising: a memory array; an access interface for external access to the memory array, the access interface comprising at least one data/address multiplexing line for transmitting data and address; and a control component configured to control the memory to perform the method according to any of the previously described embodiments of the present disclosure.

BRIEF DESCRIPTION OF FIGURES

The above and other objects, features and advantages of the present disclosure will become more apparent from the more detailed description of the exemplary embodiments of the present disclosure taken in conjunction with the accompanying drawings, wherein the same reference numerals generally refer to the same parts in exemplary embodiments of the present disclosure.

DETAILED DESCRIPTION

Figure 1:
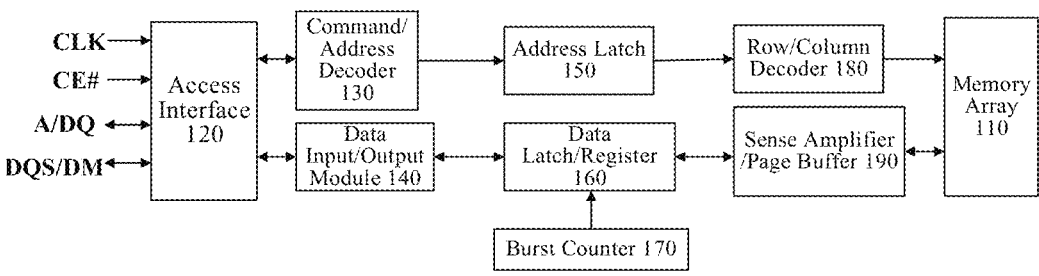
FIG. 1 illustrates an exemplary composition diagram of a memory according to an embodiment of the present disclosure.

Some embodiments of the present disclosure will be described in more detail below with reference to the accompanying drawings. Although the embodiments of the present disclosure are shown in the drawings, it should be understood that the present disclosure may be embodied in various forms and should not be limited to the embodiments set forth herein. Rather, these embodiments are provided so that this disclosure will be thorough and complete, and will fully convey the scope of the disclosure to those skilled in the art.

The technical solution of the present disclosure will be described in detail below by taking the pseudo static random access memory (PSRAM) as an example, but those skilled in the art will understand that the present disclosure is not limited thereto, and can also be applied to other memories with similar access interfaces, such as SRAM, DRAM, or flash memory.

In some embodiments, the internal memory chips in PSRAM are the same as those in DRAM, but PSRAM's external interface is different from that commonly used for DRAM. That is, the DATA lines and the Command/Address lines in the commonly used interface of DRAM are separate from each other, but the DATA lines and the Command/Address lines in the interface of PSRAM are usually all or partially multiplexed (for example, the A/DQ lines shown in the drawings described later transmit both data and command/address).

In order to distinguish the phase of transmitting address from the phase of transmitting data for a command, in the case of performing multiple read/write operations, PSRAM usually transmits, on the A/DQ lines, the command and address for the first access, followed by the data corresponding to the first access, the command and address for the second access, and then the data corresponding to the second access. After the first access is complete, it is necessary to wait for at least one preparation time (such as the tCPH as shown in the drawings described later) before starting the second access. This preparation time is, for example, the time required to deactivate the preceding access's word line (WL), save the corresponding data, and ensure that the subsequent access can start. During this preparation time, the chip enable signal CE# is usually pulled up and held high.

The present disclosure finds that, the existence of the preparation time affects the access speed. In addition, the present disclosure finds that, it is not necessary to wait until the preceding access operation is completely finished before starting the subsequent access operation (read/write operation), but these two consecutive read/write operations can be partially executed in parallel, similar to the pipelining operations.

Therefore, the present disclosure proposes various novel access modes for memory, which can perform multiple corresponding access operations for multiple random access addresses in succession, and reduce the interval time between two accesses relative to existing access methods, thereby improving access speed. In this context, the term "random" address refers to an address that can be arbitrarily specified by the user.

The solution of the present disclosure will be elaborated in detail in combination with specific embodiments.

FIG. 1 illustrates an exemplary composition diagram of a memory according to an embodiment of the present disclosure.

As shown in FIG. 1, the memory 100 includes a memory array 110 and an access interface 120 for external access to the memory array, where the access interface 120 at least includes at least one data/address multiplexing line A/DQ for transmitting data and address.

FIG. 1 is an exemplary internal block diagram of the memory 100, taking some PSRAMs as an example. The access interface 120 in FIG. 1 may use the SPI (Serial Peripheral Interface) protocol to communicate with an external host. The SPI protocol in this disclosure may include its various versions, such as single-port, dual-port, 4-port, 8-port SPI protocol or the like. Here, "single-port", "dual-port", "4-port", or "8-port" means that, the number of data/address multiplexing line(s) A/DQ is 1, 2, 4, or 8, or in other words, the A/DQ line(s) is 1-bit wide, 2-bit wide, 4-bit wide, or 8-bit wide, and thus the number of bits of data/address that can be transmitted in parallel is 1, 2, 4, or 8. Below, various embodiments of this disclosure will be described by taking an 8-port SPI (the A/DQ transmits 1 byte (i.e. 8 bits) in parallel every time) as an example. However, those skilled in the art may understand that the technical solution of this disclosure is not limited to the number of bits, nor is it limited to the SPI protocol. The embodiments of this disclosure are also applicable to other kind of access interface 120 with multiplexed data and address lines. In general, the number of A/DQ lines is $2^N$, and $2^N$ or $2^{N+1}$ bits of data or address are output or received via the A/DQ lines per clock cycle, where N is a non-negative integer. If the access interface 120 uses SDR timing, then the A/DQ lines transmit $2^N$ bits per clock cycle; if the access interface 120 uses DDR timing, then A/DQ lines transmit $2^{N+1}$ bits per clock cycle. It may be noted that, in one embodiment of this disclosure, the operation for each access address uses a byte as the minimum addressing unit (i.e. in the waveform diagrams of FIGS. 2-12 below the data size of each Dout/Din is 1 byte), and if the memory is accessed in burst mode, the amount of data read or written per access address is equal to a burst length*8 bits, where the burst length represents the amount of data read/written per access address (in bytes), which is preset in a mode register. In addition, in some embodiments, in addition to the data/address multiplexing lines A/DQ, the access interface 120 may also include other transmission lines to separately transmit a portion of the data or the address; for example, the access interface 120 may also include separate address line(s) to transmit the address together with and in parallel with the data/address multiplexing lines A/DQ.

Those skilled in the art may understand that the internal circuits of the memory 100 shown in FIG. 1 are simplified block diagrams drawn for the purpose of illustrating the basic processing involved in reading and writing operations to the memory array, and other components/modules may be omitted and not shown. Moreover, the settings and connection relationships of these internal circuit modules are not limited to those shown in FIG. 1, but may be set according to the need of the memory.

In some embodiments, as shown in FIG. 1, the access interface 120 includes a clock signal line CLK, a chip enable line CE#, and a set of (eight) data/address multiplexing lines A/DQ, used for implementing the SPI protocol. In addition, optionally, the access interface 120 also includes a transmission line DQS/DM, which is used to output a signal DQS for synchronizing the sampling of data output on the A/DQ lines in the case of read operations, and to receive a signal DM for masking the data received on the A/DQ lines in the case of write operations. When the host accesses the memory 100 (performs read/write operations), the host may output a clock signal CLK to the memory to control the signal transmission timing, pull down the CE# signal to select the memory, and use the A/DQ lines to exchange with the memory commands, addresses, and data related to the read/write operations. In addition, during read operations, the memory may use the DQS signal to ensure that the host correctly obtains the read data; during write operations, the host may use the DM signal to mask part of the input data so as not to be written to the corresponding address, thus can provide the user with a more flexible writing method. In addition, although not shown, as will be described in detail later, in some embodiments, the access interface 120 may also include a transmission line for other purpose, such as another transmission line for implementing handshaking with the host to indicate that a new address can be received.

In some embodiments, as shown in FIG. 1, in addition to the aforementioned memory array 110 and access interface 120, the memory 100 may also include an command/address decoder 130, a data input/output module 140, an address latch 150, a data latch/register 160, a burst counter 170, a row/column decoder 180, and a sense amplifier (SA)/page buffer 190, which are used to perform corresponding read and write operations on the memory array 110 based on the information received by the access interface 120. In this disclosure, these components (such as the modules in FIG. 1 other than the access interface 120 and memory array 110, including other possible modules not shown) used for read and write operations on the memory array in the internal circuitry of the memory may be collectively referred to as a control component, which is configured to control the memory to implement corresponding preset read and write operations (such as to perform memory operation modes in the embodiments described later) on the memory array based on the information received by the access interface.

In some embodiments, the command/address decoder 130 may decode the command received using the A/DQ lines, thereby generating various control signals related to its corresponding operation mode, and may store the received addresses in the address latch 150 in sequence. The size of the address latch 150 may be set according to the requirement (such as the number of addresses to be pre-stored). A register may also be used to achieve the same function instead of the latch. The address latch 150 may be a first-in first-out latch, which may allow to perform read/write operations in sequence according to the receiving order of addresses, so that the order of the read or written data transmitted via the A/DQ lines is consistent with the receiving order of addresses. The address latch 150 sends a pre-stored access address to the row/column decoder 180, which decodes the row address and column address therein, respectively, so as to activate the word line WL corresponding to the row address and the bit line BL corresponding to the column address, thereby performing corresponding read/write operation on the memory cell selected by the activated WL and BL in the memory array 110. For the read operation, the sense amplifier/page buffer 190 may send the read data to the data latch/register 160 which may perform parallel-to-serial conversion on the data as needed and then send it to the data input/output module 140 for subsequent serial output through the access interface 120. For the write operation, the data input/output module 140 may receive the data to be written input by the access interface 120, and send it to the data latch/register 160 which may perform serial-to-parallel conversion on the data as needed and then send it to the sense amplifier/page buffer 190 for subsequent parallel writing to the memory cells. The sizes of the data latch/register 160 for serial-parallel conversion and the sense amplifier/page buffer 190 may be adjusted appropriately according to the specific application, the required frequency or the like.

In addition, as mentioned earlier, in some embodiments, read/write operations usually use the burst mode. For example, after starting a read/write operation for an access address, a preset burst length of bytes are continuously read or written, that is, starting from the access address the burst length of bytes are automatically and continuously read or written. The burst length may usually be set by the user in advance. Therefore, during the read/write operation, the burst counter 170 may be used to determine whether the burst transmission of the read/write operation is complete. The burst counter 170 may be set separately as shown in FIG. 1, or may be multiplexed with other counters (such as a wrap counter).

Several embodiments of the access modes of the present disclosure will be described in detail below in conjunction with the access interface example of FIG. 1.

Embodiment 1: Random Column Access Mode

In this disclosure, "random column access" means accessing (reading/writing) multiple random column addresses in the same row. Further, "accessing multiple random column addresses in the same row" refers to accessing memory cells corresponding to multiple random bit lines BLs and the same word line WL in the memory array 110.

The present disclosure notes that in the random column access (taking read operation as an example) of traditional PSRAM, after the chip enable signal CE# is pulled down, it is necessary to receive the row address (RA) and column address (CA) of the first access through the A/DQ lines, decode them through internal circuits to control the activating of the corresponding WL and BL, read out the corresponding data and place it on the A/DQ lines, and then deactivate the WL, pull up CE# for a certain period of time (for example, tCPH) and then pull it down again to start the second access which performs similar actions as those aforementioned for the first access. Therefore, after finishing each access, it is necessary to pull up CE# and wait tCPH, and the latency from transmitting the first access's column address CA0 on the A/DQ lines to returning the first data DO corresponding to CA0 may be, for example, the "read latency" shown in FIG. 2 below. As mentioned earlier, due to the command/address and data multiplexing A/DQ lines, the WL needs to be deactivated after finishing each access, regardless of whether the subsequent RA is the same. Therefore, there are the aforementioned read latency and tCPH for every access. Moreover, even if multiple CAs with the same RA are continuously accessed, the PSRAM of the prior art requires multiple switching (between activating and deactivating) of the WL, which affects the access speed due to the time-consuming switching of WL each time.

Therefore, Embodiment 1 of the present disclosure proposes a new random column access mode, in which continuous read or write operations can be performed on the memory array in response to multiple received access addresses, where the multiple access addresses have a same row address and random column addresses. After starting the random column access mode of the present disclosure, multiple access addresses may be received via the A/DQ lines, where the multiple access addresses are transmitted in the form of a common row address RA and at least one column address CA. Read/write operations are performed in response to these access addresses until CE# is pulled up (i.e., an invalid chip enable signal is received) to end the mode. Thus, the tCPH time between two sequential accesses is eliminated, and because part of the two sequential read/write operations can be processed in parallel (for example, while outputting the read data for the preceding access through the A/DQ lines, the BL corresponding to the subsequent access's CA can be activated and its corresponding data can be read out), the latency required for the subsequent CA's read/write operation can also be shortened.

In some embodiments, in the random column access mode of this disclosure, since the consecutive accesses have the same RA, its corresponding WL may remain activated to allow to perform continuous read/write operations on multiple random CAs until the mode is ended by pulling up the CE#. This not only eliminates the tCPH time between two sequential accesses, and can further shorten or even eliminate the latency required for the subsequent CA's read/write operation. That is to say, in some examples of the random column access mode disclosed in this disclosure, the word line corresponding to the received common row address remains activated, during the period from the beginning of the first read/write operation to the end of the last read/write operation.

Next, several examples of the random column access mode will be discussed in detail in conjunction with the timing diagrams shown in the accompanying drawings. Those skilled in the art will appreciate that many of the details described below are provided merely for the sake of completeness of the description and are not intended to limit the technical solution of the present disclosure.

Read Operation Example 1

Figure 2:
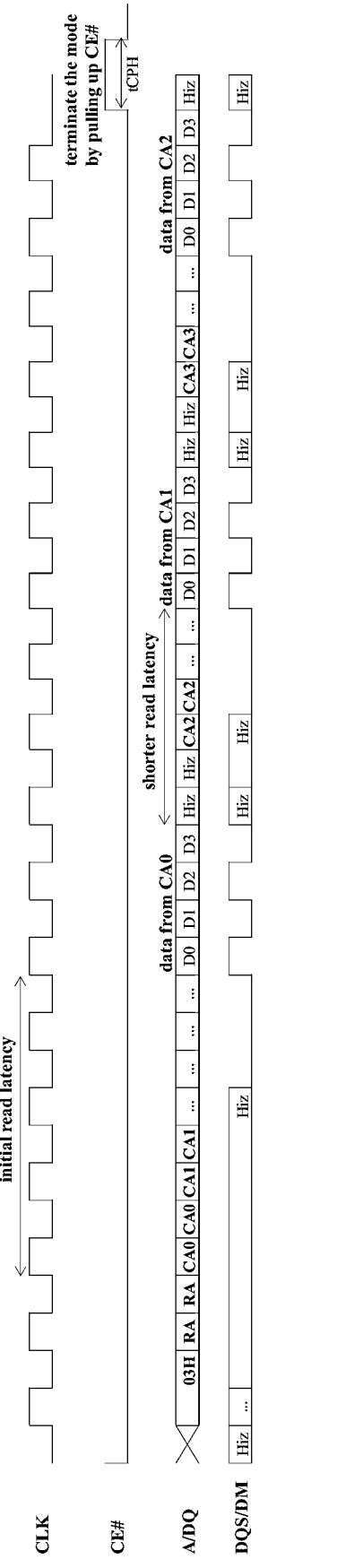
FIG. 2 illustrates a timing diagram of a read operation mode as an example of a random column access mode according to an embodiment of the present disclosure.

FIG. 2 illustrates a timing diagram of a read operation mode example 1 of the random column access mode according to an embodiment of the present disclosure.

As shown in FIG. 2, the host sends the clock signal CLK to the memory, pulls down the chip enable signal CE#(for this signal, a low level indicates valid and a high level indicates invalid), and sends a random column read command (in the embodiment of FIG. 2, this command is "03H"), thereby starting the random column access mode specified by the command. Those skilled in the art will understand that "03H" and the command values in the subsequent embodiments are only exemplary hexadecimal numbers of one byte, and do not impose any limitations on the value of each command; any value can be pre-agreed upon as the value of each command as needed, and its number of bits is also not limited.

In addition, in other embodiments, it is also possible to start a specified random column access mode by presetting a specific register (such as the mode register) in the memory, thereby eliminating the transmission of command values (indicated as "03H" in the embodiment of FIG. 2) in the timing diagrams of FIG. 2 and subsequent embodiments, further saving time.

After transmitting the command, the host sends a common row address RA and two column addresses CA0 and CA1 on the A/DQ lines. In this example, the row address and column address are both 16 bits (2 bytes), while the SPI interface has a bit width of 8 bits (for example, the interface adopts Octal SPI), so sending each address takes up 2 transmission cycles. In the example timing diagrams in this article, the data transmission on the A/DQ lines uses DDR (Double Data Rate) timing, which means that A/DQ can be transmitted on both the rising and falling edges of the CLK, so in fact each transmission cycle is half a clock cycle. Those skilled in the art understand that the embodiments of the present disclosure are not limited to the DDR timing, and SDR (Single Data Rate) timing can also be used, which means that data is transmitted only once on the rising or falling edge of a clock cycle.

As shown in FIG. 2, the host starts receiving data from CA0 (i.e., the data read in bursts from the memory cells selected by using RA and CA0) after the initial read latency from sending CA0. The burst length is set to 4 bytes, so 4 bytes of data D0-D3 are continuously output. In some embodiments, the burst length for each read/write operation or a default burst length may be set by presetting the mode register.

In the example of FIG. 2, there is still a read latency from the end of transmitting the data from CA0 to the beginning of transmitting the data from CA1, that is, between two consecutive read operations. However, as mentioned earlier, some stages of the read operation in response to CA1 can be performed in parallel with the read operation in response to CA0, so the read latency is shorter than the initial read latency, which is indicated as the "shorter read latency" in FIG. 2. Therefore, the example of FIG. 2 proposes that a new column address (such as CA2, CA3, etc.) may be inserted during the necessary read latency, that is, between every two pieces of read data outputted in sequence, to further reduce the access time and improve the access speed.

The timing at which the host can send (i.e., the memory receives) a new column address may be determined by the preset data amount of the previous read operation (for example, four different burst lengths may be set through MRX[1:0] in the mode register) or the number of clock cycles required for the previous read operation. In other embodiments, a transmission line may be added to the SPI interface or a transmission line with other function may be multiplexed, so as to achieve handshaking with the host, to determine when to switch the transmission content on the A/DQ lines from outputting data to receiving address (for the host, it is to switch the direction of the A/DQ lines from receiving data to sending a new address). For example, the memory may use the handshaking line to send a signal to the host at the appropriate timing to allow the host to send a new address, and the host starts to send the new address on the A/DQ lines after detecting the signal, and uses the handshaking line to notify the memory that the new address has been sent.

Due to the different transmission directions of read data and new address, as shown in FIG. 2, it is necessary to wait for at least the first preset number of clock cycles (also known as IO switching clock cycles) before and after the host sends the new address to switch the data transmission direction of the A/DQ lines. The number of IO switching clock cycles may be pre-agreed through the command or a register or other methods, and indicate the time required to switch the data transmission direction of the A/DQ lines between "receiving" and "sending". In some embodiments, the host may determine how many clock cycles are required for the IO switching based on the operating frequency synchronized with the PSRAM (i.e., the frequency of the clock signal CLK, such as 200 M), and then set the number of clock cycles in the mode register.

In addition, as shown in FIG. 2, if the initial read latency is longer than the time required for the IO switching plus CA0+CA1 transmission, additional waiting time is required between CA1 and the data from CA0. Dummy clock cycles (abbreviated as "dummy clk") may be used to indicate the total waiting time from the end of CA1 transmission to the start of transmission of data from CA0, during which the IO switching may be performed. In some embodiments, the number of the dummy clk may be represented as a second preset number, which may be preset in the mode register based on the initial read latency and the frequency of the clock signal CLK. Additionally, similarly, if the shorter read latency is longer than the time required for the two IO switching operations plus the CA2 transmission, an additional waiting time may also be set between CA2 and the data from CA1, during which the IO switching may be performed. The "dummy clk" may also be used to indicate the total waiting time between CA2 and the data from CA1. In some embodiments, the number of this dummy clk may be represented as a third preset number, which may be preset in the mode register based on the shorter read latency and the frequency of the clock signal CLK. In other embodiments, alternatively, the additional waiting time may be set between CA2 and the preceding data from CA0, or distributed between CA2 and the preceding read data and between CA2 and the subsequent read data. In addition, in some cases, the data from CA0 may be long enough and/or the time interval between two read operations may be short enough, so that there is no read latency or a very short read latency between the transmission of data from CA0 and the transmission of data from CA1. In this case, a new column address may also be inserted between every two pieces of read data that are outputted in sequence, and only the waiting time required for IO switching (i.e., the aforementioned first preset amount of "IO switching clock cycles") may be set between the new address and the preceding data and between the new address and the subsequent data. In some embodiments, during the aforementioned IO switching clock cycles and/or dummy clock cycles of the read operations, due to the need to switch the transmission direction of the data/address multiplexing lines A/DQ, the data/address multiplexing lines A/DQ are released to a high-resistance state, which may be represented by "Hiz" or " . . . " in the timing diagrams of the present disclosure.

Next, as shown in FIG. 2, after the memory outputs the data from CA1, it may also continue to receive a new column address CA3 and then output data from CA2. Although FIG. 2 pulls up CE# to end the current command mode, after the host finishes receiving the data from CA2, those skilled in the art may understand that the number of read operations in FIG. 2 is only exemplary. The number of read operations (i.e., the total number of received column addresses) that can be performed in this random column access mode is not limited. The memory may receive a new column address after finishing transmitting each read data as needed, respond to the new column address to perform a read operation, and then output the corresponding read data, until the host no longer needs to continue the read operation and pulls up CE# to end the random column access mode. In addition, as shown in FIG. 2, the last received new column address (such as CA3) in this command mode is usually discarded, which means that there is actually no need for a corresponding read operation for the last received new column address.

In some embodiments, in the random column access mode of the present disclosure and in the subsequent embodiments discussed, when an invalid chip enable signal is received (i.e., CE# is pulled up), if there is still read/write operation(s) in response to the received column address or access address that has not been completed (including the case where it has not yet begun), then the column address or access address whose corresponding read operation has not yet started may be discarded, or the column address or access address whose corresponding written data has not yet been received any may be discarded, i.e., no read/write operation will be performed for the discarded address. For the ongoing read operation, the mode will not be ended until the ongoing read operation is completed, or the ongoing read operation may be abandoned and the output of its read data may be abandoned. For the ongoing write operation or the write operation whose written data is being received, part of the written data may be discarded. For example, for the received data whose number of bits is not a multiple of 2 to the power of N (such as 8, 16, 32, etc.) when CE# is pulled up, the remainder of the data whose number of bits does not reach the 2 to the power of N will not be written to the memory array, where N is a preset or pre-agreed number. It may be agreed or set in advance which of the abovementioned processing methods will be used for the unfinished read/write operation.

From the above content, it may be concluded that the read timing corresponding to the exemplary read command "03H" of the random column access mode represented by the timing diagram in FIG. 2 may be expressed as follows (it is worth noting that, as mentioned earlier, the present disclosure does not limit the random column read mode to be initiated by the specific read command "03H", and in other embodiments, the random column read mode may also be initiated by presetting a specific mode register):

cmd+RA+CA0+CA1+dummy clk+CA0_data+dummy clk+CA2+dummy clk+CA1_data+dummy clk+CA3+ dummy clk+CA2_data+ . . . .

where, "cmd" represents the command, "CA0" or the like represents the respective column address, "dummy clk" represents the required dummy clock cycles set based on the circuit implementation of the memory (mainly includes the IO switching clock cycles, the waiting time required for the read latency, etc. in the embodiment of FIG. 2), which may also be removed in some cases, and "CA0_data" or the like represents the data read in response to its corresponding column address (such as CA0). Those skilled in the art may understand that, as mentioned earlier, the numbers of clock cycles for the respective dummy clks in this read timing may be the first preset number, the second preset number, or the third preset number, and may be the same or different from each other. In some embodiments, during each dummy clk that requires switching the transmission direction of the data/address multiplexing lines A/DQ, the A/DQ lines are all released to a high-resistance state.

In addition, optionally, while transmitting each piece of the read data, the memory may output the DQS signal to the host on the DQS/DM line, allowing the host to better synchronize the acquisition of the read data. "Hiz" shown in the timing diagrams of the present disclosure indicates the high-impedance state.

In addition, those skilled in the art may understand that the read command format of FIG. 2 is not intended to limit the solution of this disclosure. For example, there may be various variations of the read command format of FIG. 2, such as receiving only one column address CA0 in the initial stage, receiving a new column address after any selected read data instead of after each read data, or receiving more than one new column address continuously at one time. The various variations and combinations thereof are within the scope of the solution claimed in this disclosure.

Read Operation Example 2

Figure 3:
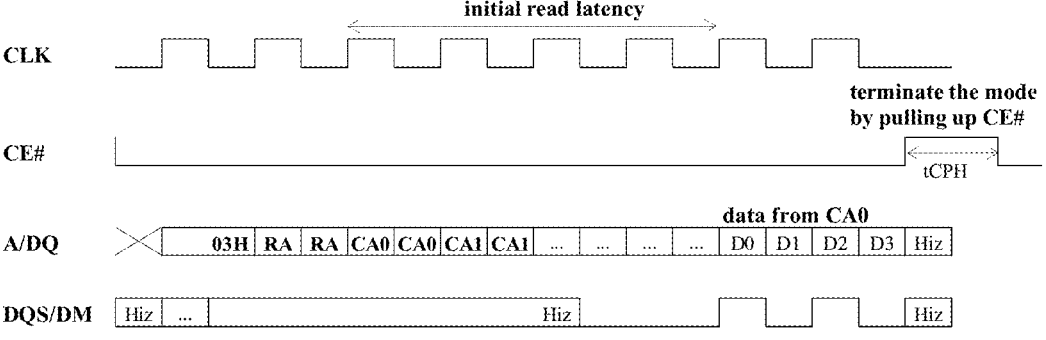
FIG. 3 illustrates a timing diagram of a read operation mode as an example of a random column access mode according to an embodiment of the present disclosure.

FIG. 3 shows a timing diagram of another read operation mode example of the random column access mode according to an embodiment of the present disclosure.

The difference between the example in FIG. 3 and the example in FIG. 2 is that when the host does not need data from the CA1 address, the host may pull up the CE# in advance to end the command mode (03H) in advance. That is, even if the format of the random column read command "03H" requires two column addresses (CA0+CA1) to be sent at the beginning, it is possible to read only the data from CA0 and then end the mode. Therefore, the host may implement any number of read operations using the above-mentioned read command "03H" mode as needed.

As detailed in the previous read operation example 1, it is possible to pre-agree or preset the processing method for the received address and data after pulling up the CE#.

Write Operation Example 1

Figure 4:
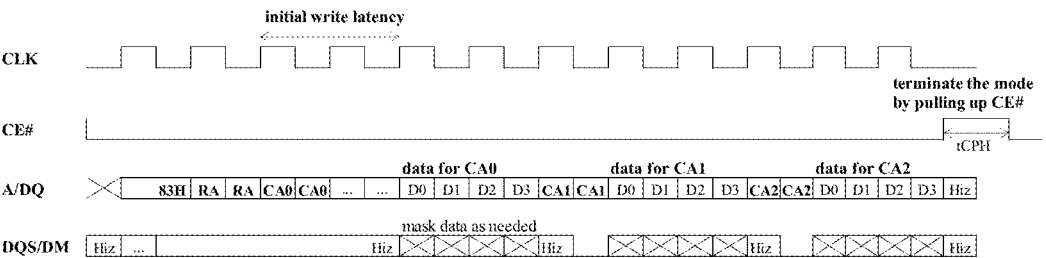
FIG. 4 illustrates a timing diagram of a write operation mode as an example of a random column access mode according to an embodiment of the present disclosure.

FIG. 4 shows a timing diagram of a write operation mode example of the random column access mode according to an embodiment of the present disclosure.

As shown in FIG. 4, the host sends the clock signal CLK to the memory, pulls down the chip enable signal CE#, and sends a random column write command (in the embodiment of FIG. 4, the command is "83H"), thereby initiating the random column access mode specified by the command.

In addition, similar to the aforementioned example, in other embodiments, the random column access mode may also be initiated by presetting a specific register (such as the mode register) in the memory, thereby eliminating the transmission of command value in FIG. 4 and further saving time.

After transmitting the command, the host sends a common row address RA and a first column address CA0 on the A/DQ lines. As in the previous example, sending each address takes up 2 transmission cycles.

As shown in FIG. 4, the host starts sending data for CA0 (i.e., data to be written in bursts into the memory cells selected by using RA and CA0, also referred to as "written data") after the initial write latency from sending CA0. The burst length is set to 4 bytes, so the host sends 4 bytes of data D0-D3 in succession. In some cases, similar to the read operation example in FIG. 2, a second preset number of clock cycles may be set between the completion of CA0 transmission and the start of transmission of data for CA0, based on the initial write latency and the frequency of the clock signal CLK, which may be referred to as "dummy clk". The second preset number may be preset in the mode register. In other cases, such as in the case there is sufficient space inside the memory to pre-store the written data, the data for CA0 may be sent immediately after CA0, without having to set a preset number of dummy clock cycles based on the initial write latency.

As mentioned earlier, some stages of two sequential write operations can be performed in parallel, resulting in shorter write latencies for subsequent write operations relative to the initial write latency, or even eliminating the write latency. Therefore, as shown in FIG. 4, after finishing sending the data for CA0, the host may seamlessly continue to send the new column address CA1 and the written data for CA1, as well as the subsequent new column address CA2 and the written data for CA2, and then pull up the CE# to end the current command mode. In this disclosure, "seamlessly" sending or receiving means sending or receiving without waiting. Since the transmission direction of both address and written data during write operations is from the host to the memory, there is no need for the IO switching and its required waiting time (i.e., the "IO switching clock cycles") as in the read operation example described earlier. The host may insert CA without gaps between sending adjacent two pieces of written data on the A/DQ lines.

Those skilled in the art may understand that the number of write operations in FIG. 4 is only exemplary, and the number of write operations that can be performed in this random column access mode (i.e., the total number of column addresses received by the memory) is not limited. The host may also send as many sets of new column address and its written data as needed after the written data for CA2 in FIG. 4, and then pull up the CE# to end the current command mode. In other words, the memory may receive a new column address and its written data each time after receiving the written data, perform corresponding write operation on it, and continue to loop until the host no longer needs to continue the write operation and pulls up the CE# to end the random column access mode.

As described in the previous read operation example 1, in some embodiments, when an invalid chip enable signal is received (i.e., CE# is pulled up), the written data for the last write operation may not have been transmitted any or may not have been completely transmitted. In this case, the last write operation may be abandoned, or the remainder of the data whose number of bits does not reach the 2 to the power of N may be discarded and not be written to the memory array, where N is a preset or pre-agreed number. For example, in some cases, data of 64 (i.e., 2 to the power of 6) bits are written in parallel to the memory array each time within the memory, so for written data with an 8-bit width transmission, the write operation will be performed by using 8 bytes of written data (from eight transmissions) as a group. If the last group of written data does not reach 8 bytes when CE# is pulled up, the entire last group of data is discarded, i.e., is not written to the memory array (for example, if data D10 is being transmitted when CE# is pulled up, the previously transmitted data D0-D7 form a group that can be written, but the remaining data D8-D10 is not enough to form a group and is discarded).

From the above content, it may be concluded that the write timing corresponding to the exemplary write command "83H" of the random column access mode represented by the timing diagram in FIG. 4 may be expressed as follows (it is worth noting that, as mentioned earlier, the present disclosure does not limit the random column write mode to be initiated by the specific write command "83H", and in other embodiments, the random column write mode may also be initiated by presetting a specific mode register):

cmd+RA+CA0+dummy     clk+CA0_data+CA1+
  CA1_data+CA2+CA2_data . . . .

where, "cmd" represents the command, "CA0" or the like represents the respective column address, "dummy clk" represents the required dummy clock cycles set based on the circuit implementation of the memory (in the embodiment of FIG. 4, mainly includes the waiting time required for the initial write latency, the number of which may be the second preset number mentioned above), which may also be removed in some cases, and "CA0_data" or the like represents the data to be written in response to its corresponding column address (such as CA0).

In addition, optionally, as shown in FIG. 4, while transmitting each written data, the host may send a DM signal on the DQS/DM line to mask the written data as needed. Although the value of the DM signal is represented by a "x" in the drawing, it may be understood that the DM signal may be set to high or low level as needed during the period of transmitting each data. For example, in some cases, the DM signal is valid at high level, and if the host does not want to write the D1 data in the data for CA0 into the memory array, the DM signal for the same half clock cycle as the transmission of the D1 data may be set to 1, thus masking the D1 data.

In addition, those skilled in the art may understand that the write command format of FIG. 4 is not intended to limit the solution of the present disclosure. For example, there may also be various variations of the write command format of FIG. 4, such as receiving more than one column address (e.g., CA0+CA1+ . . . ) in the initial stage, receiving a new column address after any selected written data instead of after each written data, or receiving more than one new column address continuously at one time. The various variations and combinations thereof are within the scope of the solution claimed in the present disclosure.

In the examples of read/write operations given earlier, it is not necessary to preset the number of consecutive read/write operations, that is, any number of consecutive read/write operations can be performed. As long as the specific access mode that has been initiated has not been ended (i.e., no high CE# has been received), the memory can constantly receive new addresses and perform read/write operations based on them.

In addition, in other embodiments, as detailed in Embodiment 3 below, the random column access mode of the present disclosure may also include a mode, in which the number of consecutive read/write operations is preset, and after starting the mode, a common row address and a predetermined number of column addresses are received in sequence, and then the corresponding read/written data for the received addresses is transmitted in sequence. Although this mode is discussed in Embodiment 3 as a specific example of a fixed-number random access mode, it can also be referred to as a specific example of the random column access mode; these two modes are divided from different perspectives, and it does not mean that they are completely different modes.

Embodiment 2: Random Row Access Mode

This mode can also be referred to as a multi-page access mode, which means accessing (reading/writing) random column addresses in multiple random rows (multiple random pages). One page corresponds to one row, which refers to the total amount of data stored for one WL (e.g., 1K).

For conventional DRAM, since DRAM is divided into banks, all the corresponding WLs of the banks can be activated, and data from different banks can be accessed in parallel by switching different RA and CA. However, for conventional PSRAM, due to cost considerations, PSRAM is usually not divided into multiple banks, so only one WL can be activated at a time. In addition, due to its command/address and data multiplexing lines A/DQ, it is less efficient for multi-page access.

Thus, Embodiment 2 of the present disclosure designs a random row access mode for different RA switching (i.e., different WL switching). In this mode, it is able to perform continuous read or write operations on the memory array in response to multiple received access addresses, where the multiple access addresses have random row addresses and random column addresses. After starting the random row access mode of the present disclosure, at least two access addresses may be received initially via the A/DQ lines, and optionally new access addresses may be received subsequently. Read/write operations are performed in response to these access addresses until CE# is pulled up (i.e., an invalid chip enable signal is received) to end the mode. Thus, the tCPH time between two consecutive accesses is eliminated, and because some stages of the two consecutive read operations can be processed in parallel with each other, the latency required for the subsequent read operation can also be shortened. In one embodiment, before finishing outputting the data in response to the preceding read operation for RA0CA0 via the A/DQ lines, the word line switching process required for the subsequent read operation for RA1CA1 is initiated. The word line switching process is, for example, deactivating the word line WL0 corresponding to the row address RA0 of the preceding read operation and activating the word line WL1 corresponding to the row address RA1 of the subsequent read operation. In other embodiments, since multiple addresses for read operations, such as RA0CA0, RA1CA1, and RA2CA2, have been pre-stored in the address latch 150 in advance, if the number of data latches/registries 160 is also sufficient, the word line switching process required for the subsequent read operation for RA2CA2 can be performed even while outputting the data in response to the preceding read operation for RA0CA0 via the A/DQ lines.

Several examples of the random row access mode are discussed in detail below in conjunction with the timing diagrams shown in the accompanying drawings. Those skilled in the art understand that many of the details described below are provided as examples merely for completeness of the solution and are not intended to limit the technical solution of the present disclosure.

Read Operation Example 1

Figures 5, 6, 7:
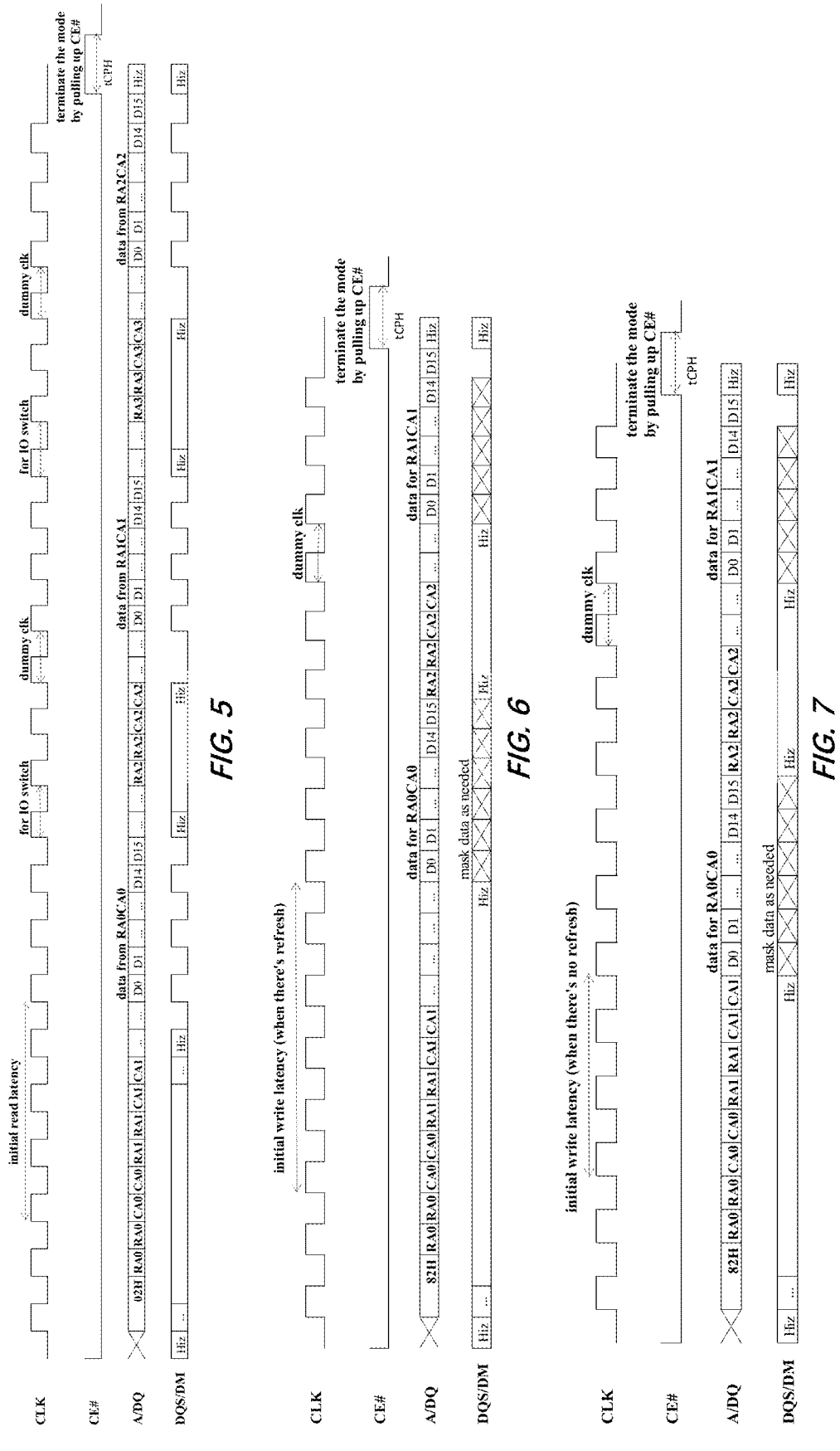
FIG. 5 illustrates a timing diagram of a read operation mode as an example of a random row access mode according to an embodiment of the present disclosure.
FIGS. 6 and 7 illustrate timing diagrams for two cases of a write operation mode as an example of a random row access mode according to an embodiment of the present disclosure.

FIG. 5 illustrates a timing diagram of read operation mode example 1 of the random row access mode according to an embodiment of the present disclosure.

As shown in FIG. 5, the host sends the clock signal CLK to the memory, pulls down the chip enable signal CE#, and sends a random row read command (in the embodiment of FIG. 5, the command is "02H"), thereby initiating the random row access mode specified by the command.

In addition, in other embodiments, it is also possible to start a specified random row access mode by presetting a specific register (such as the mode register) in the memory, thereby eliminating the transmission of the command value (indicated as "02H" in the embodiment of FIG. 5) in FIG. 5, further saving time.

After transmitting the command, the host continuously sends two access addresses on the A/DQ lines, namely RA0+CA0 and RA1+CA1. Similar to the previous example, sending each row address or column address takes up 2 transmission cycles.

As shown in FIG. 5, the host starts receiving data from RA0CA0 (i.e., the data read in bursts from the memory cells selected by using RA0 and CA0) after the initial read latency from sending CA0. The burst length is set to 16 bytes, so 16 bytes of data D0-D15 are output continuously. In other words, activating one WL will lead to consecutively reading 16 Dout. In some embodiments, the burst length for each read/write operation or a default burst length may be set by presetting the mode register. In some embodiments of the random row access mode, the lowest 3 bits of each column address are set to 0, that is, CA[2:0]=000.

In some embodiments, PSRAM first activates the WL corresponding to RA0, and then activates the BL corresponding to CA0, to read the data (D0-D15) from RA0CA0 and send it to the IO bus. Since the PSRAM has internally pre-stored the address RA1+CA1 for the next access, while sending out the read data through the A/DQ lines, it may be executed in parallel to deactivate the WL corresponding to RA0, activate the WL corresponding to RA1, activate the BL corresponding to CA1, and read the data from RA1CA1. Therefore, the output processing of the data for the preceding read operation is performed at least partially in parallel with the word line switching processing required for the subsequent read operation, and at least the time for the parallel part of the processing can be saved between the two consecutive read operations.

Similar to the example described above in conjunction with FIG. 2, in the example of FIG. 5, a new access address (such as RA2+CA2, RA3+CA3, etc.) may be inserted during the read latency that exists between two consecutive read operations, that is, between every two pieces of read data outputted in sequence, thereby further reducing the access time and improving the access speed.

Similar to the example described earlier in conjunction with FIG. 2, the timing at which the host can send (i.e., the memory receives) a new access address may be determined by the preset data amount of the previous read operation (such as the burst length) or the number of clock cycles required for the previous read operation. It is also possible to let the PSRAM know when to deactivate the currently-activated WL. In other embodiments, a transmission line may be added to the SPI interface or a transmission line with other function may be multiplexed, so as to achieve hand-shaking with the host, thus determining when to switch the transmission content on the A/DQ lines from outputting data to receiving address (for the host, it is to switch the direction of the A/DQ lines from receiving data to sending a new address).

Similar to the example described above in conjunction with FIG. 2, due to the different transmission directions of read data and new address, as shown in FIG. 5, it is necessary to wait for at least the first preset number of clock cycles before and after the host sends the new address to switch the data transmission direction of the A/DQ lines. The first preset number may be pre-agreed through the command or a register or other methods, and indicate the time required to switch the data transmission direction of the A/DQ lines between "receiving" and "sending". In some embodiments, the host may determine how many clock cycles are required for the IO switching based on the operating frequency synchronized with the PSRAM, and then set the number of clock cycles in the mode register.

Similar to the example described earlier in conjunction with FIG. 2, if the initial read latency is longer than the time required for the IO switching plus RA0+CA0+RA1+CA1 transmission, additional waiting time is required between CA1 and the data from RA0CA0. The "dummy clk" may be used to indicate the total waiting time from the end of CA1 transmission to the beginning of transmission of data from RA0CA0, during which the IO switching may be performed. In some embodiments, the number of this dummy clk may be represented as a second preset number, which may be preset in the mode register based on the initial read latency and the frequency of the clock signal CLK. In addition, similarly, if the subsequent shorter read latency is longer than the time required for the two IO switching operations plus the transmission of RA2+CA2, then an additional waiting time may also be set between RA2+CA2 and the data from RA1CA1 and/or between RA2+CA2 and the previous data from RA0CA0, during which the IO switching may be performed. The "dummy clk" may also be used to indicate the total waiting time between RA2+CA2 and the data from RA1CA1 and/or between RA2+CA2 and the previous data from RA0CA0. In some embodiments, the number of this dummy clk may be represented as a third preset number, which may be preset in the mode register based on the time required for the word line switching operation (that is, the time required to deactivate the word line corresponding to the preceding access address RA0 and activate the word line corresponding to the subsequent access address RA1), as well as the frequency of the clock signal CLK. In addition, in some cases, the data from RA0CA0 may be long enough and/or the time interval between two read operations may be short enough, so that there is no read latency or a very short read latency between the transmission of data from RA0CA0 and the transmission of data from RA1CA1. In this case, a new access address may also be inserted between every two pieces of read data outputted in sequence, and only the waiting time required for IO switching (that is, the aforementioned first preset number of "IO switching clock cycles") may be set between the new address and the preceding data and between the new address and the subsequent data. In some embodiments, during the aforementioned IO switching clock cycles and/or dummy clock cycles, when a read operation is indicated, due to the need to switch the transmission direction of the data/address multiplexing lines A/DQ, the data/address multiplexing lines A/DQ are released to a high-resistance state.

Next, as shown in FIG. 5, after the memory outputs the data from RA1CA1, it may also continue to receive a new access address RA3+CA3 and then output data from RA2CA2. Although FIG. 5 pulls up CE# to end the current command mode after the host finishes receiving the data from RA2CA2, those skilled in the art may understand that the number of read operations in FIG. 5 is only exemplary. The number of read operations (i.e., the total number of received access addresses) that can be performed in this random row access mode is not limited. The memory may receive a new access address after finishing transmitting each read data as needed, perform a read operation in response to the new access address, and then output the corresponding read data, until the host no longer needs to continue the read operation and pulls up CE# to end the random row access mode. In addition, as shown in FIG. 5, the last received new access address (such as RA3+CA3) in this command mode is usually discarded, which means that there is actually no need to perform a corresponding read operation for the last received new address.

As described in the previous example of FIG. 2, in some embodiments, CE# may be pulled up in advance, and various processing methods that have been agreed upon or set up in advance may be used for the unfinished read operations at this time.

From the above content, it may be concluded that the read timing corresponding to the exemplary read command "02H" of the random row access mode represented by the timing diagram in FIG. 5 may be expressed as follows (it is worth noting that, as mentioned earlier, this disclosure does not limit the random row read mode to be initiated with the specific read command "02H", and in other embodiments, the random row read mode may also be initiated by preset-ting a specific mode register):

cmd+RA0+CA0+RA1+CA1+dummy        clk+
        RA0CA0_data+dummy clk+RA2+CA2+dummy clk+
        RA1CA1_data+dummy clk+RA3+CA3+dummy clk+
        RA2CA2_data+ . . . .

where, "cmd" represents the command, "RA0" or the like represents the respective row address, "CA0" or the like represents the respective column address, "dummy clk" represents the required dummy clock cycles set based on the circuit implementation of the memory (mainly includes the IO switching clock cycles, the waiting time required for the read latency, etc.), which may also be removed in some cases, and "RA0CA0_data" or the like represents the data read in response to its corresponding row address such as RA0 and column address such as CA0. Those skilled in the art may understand that, as mentioned earlier, the numbers of clock cycles for the respective dummy clks in this read timing may be the first preset number, the second preset number, or the third preset number, and may be the same or different from each other. In addition, whether to set the dummy clk and the required number of the dummy clks are related to the specific design of the memory. In some embodiments, during each dummy clk that requires switching the transmission direction of the data/address multiplexing lines A/DQ, the A/DQ lines are all released to a high-resistance state.

In addition, similar to the example described above in conjunction with FIG. 2, optionally, while transmitting each piece of read data, the memory may output the DQS signal on the DQS/DM line to the host, allowing the host to better synchronize the acquisition of the read data.

In addition, those skilled in the art may understand that the read command format of FIG. 5 is not intended to limit the solution of this disclosure. For example, there may be various variations of the read command format of FIG. 5, such as receiving more than two access addresses in the initial stage, receiving a new access address after any selected read data instead of after each read data, or receiving more than one new access address continuously at one time. The various variations and combinations thereof are within the scope of the solution claimed in this disclosure.

Write Operation Example 1

FIGS. 6 and 7 illustrate timing diagrams of two cases of a write operation mode example of the random row access mode according to an embodiment of the present disclosure.

As can be seen from the two drawings, the difference between FIG. 7 and FIG. 6 lies only in that, in FIG. 7 there is no additional write latency caused by refresh. Specifically, PSRAM is self-refresh, and its refresh operation has its own independent execution order that is parallel to read/write operations. Therefore, some read/write operations may encounter refresh, that is, the row that they are reading or writing is undergoing refresh. In some cases, for write operations, when there is refresh, it may take longer to wait, that is, as shown in FIG. 6 and FIG. 7, the initial write latency when there is refresh (FIG. 6) is longer than the initial write latency when there is no refresh (FIG. 7). In some embodiments, the write latencies (or the numbers of corresponding dummy clock cycles (dummy clk)) in these two cases may be pre-agreed and the corresponding setting may be selected based on the refreshing situation during the write operation.

This write operation mode example will be discussed in details below mainly in conjunction with FIG. 6.

As shown in FIG. 6, the host sends the clock signal CLK to the memory, pulls down the chip enable signal CE#, and sends a random row write command (in the embodiment of FIG. 6, the command is "82H"), thereby initiating the random row access mode specified by the command.

In addition, similar to the aforementioned example, in other embodiments, the random row access mode may also be initiated by presetting a specific register (such as the mode register) in the memory, thereby eliminating the transmissions of command values in FIGS. 6 and 7, further saving time.

After transmitting the command, the host consecutively sends two access addresses on the A/DQ lines, namely RA0+CA0 and RA1+CA1. Similar to the previous example, sending each row address or column address takes up 2 transmission cycles.

As shown in FIG. 6, the host starts sending data for RA0CA0 (that is, data to be written in bursts to the memory cells selected by using RA0 and CA0, also referred to as "written data"), after the initial write latency from sending CA1. At this time, the burst length is set to 16 bytes, so the host consecutively sends 16 bytes of data D0-D15. In some cases, similar to the read operation example shown in FIG. 2, a second preset number of clock cycles may be set between the completion of CA1 transmission and the start of transmission of data for RA0CA0 based on the initial write latency and the frequency of the clock signal CLK, which may be referred to as "dummy clk". The second preset number may be preset in the mode register. In other cases, such as when there is sufficient space inside the memory to pre-store the written data, it is also possible to send the data for RA0CA0 immediately after CA1, without having to set a preset number of dummy clock cycles based on the initial write latency.

Similar to the previous example, due to the pre-stored access address for the subsequent operation, some stages of two sequential write operations can be performed in parallel. In one embodiment, before finishing receiving the data in response to the subsequent write operation for RA1CA1 via the A/DQ lines, the word line switching process required for the subsequent write operation is initiated. The word line switching process is, for example, deactivating the word line WL0 corresponding to the row address RA0 of the preceding write operation and activating the word line WL1 corresponding to the row address RA1 of the subsequent write operation. In other embodiments, since multiple addresses such as RA0CA0, RA1CA1, etc. for multiple write operations have been pre-stored in the address latch 150 in advance, if the number of data latches/registries 160 is sufficient, the word line switching process required for the preceding write operation for RA0CA0 can be performed partially in parallel with even the receiving process of the data of the subsequent write operation for RA1CA1, thereby reducing the time of consecutive write operations and improving access speed. In some cases, due to the need for WL switching between the two consecutive access operations in the random row access mode, the subsequent write latency is longer than that in the random column access mode. Similar to the previous example in FIG. 5, a third preset number of dummy clock cycles may be inserted between the two consecutive pieces of written data as needed. For example, the third preset number may be preset in the mode register according to the word line switching operation, that is, the time required to deactivate the word line corresponding to the preceding access address and activate the word line corresponding to the subsequent access address, as well as the frequency of the clock signal CLK. Therefore, as shown in FIG. 6, after finishing sending the data for RA0CA0, the host may seamlessly continue to send the new access address RA2+CA2, and then wait for a preset number of dummy clock cycles before sending the written data for RA1CA1, and then pull up CE# to end the current command mode.

As those skilled in the art may appreciate, the number of write operations in FIG. 6 is only exemplary. The number of write operations that can be performed in this random row access mode (i.e., the total number of access addresses received by the memory) is not limited. The host may also send new access addresses RA3+CA3 and written data for RA2CA2 after written data for RA1CA1 in FIG. 6 as needed, and continue to loop until the host no longer needs to continue write operation and pulls up CE# to end the current command mode. In other words, the memory may receive a new access address between every two pieces of written data sequentially received respectively in response to two previously received access addresses, and continue to loop until the host pulls up CE# to end the mode. In addition, as shown in FIG. 6, the last received new access address (such as RA2+CA2) in this command mode is usually discarded, which means that there is actually no need to perform corresponding write operation on it.

As mentioned in the previous examples, in some embodiments, when an invalid chip enable signal is received (i.e., CE# is pulled up), the last written data may not have been transmitted any or may not have been transmitted completely. In this case, the last write operation may be abandoned, or the remainder of the data whose number of bits does not reach the 2 to the power of N may be discarded and not be written to the memory array, where N is a preset or pre-agreed number.

From the above content, it may be concluded that the write timing corresponding to the exemplary write command "82H" of the random row access mode represented by the timing diagrams of FIG. 6 and FIG. 7 may be expressed as follows (it is worth noting that, as mentioned earlier, this disclosure does not limit the random row write mode to be initiated by the specific write command "82H", and in other embodiments, the random row write mode may also be initiated by presetting a specific mode register):

cmd+RA0+CA0+RA1+CA1+dummy        clk+
  RA0CA0_data+RA2+CA2+dummy        clk+
  RA1CA1_data+RA3+CA3+dummy        clk+
  RA2CA2_data+ . . . .

where, "cmd" represents the command, "RA0" or the like represents the respective row address, "CA0" or the like represents the respective column address, "dummy clk" represents the required dummy clock cycles set based on the circuit implementation of the memory, which may also be removed in some cases, and "RA0CA0_data" or the like represents the data to be written in response to its corresponding row address such as RA0 and column address such as CA0.

In addition, as shown in FIG. 7, in some embodiments, when there is no refresh, the dummy clk between the second access address RA1+CA1 and the written data RA0CA0_data for the first access may be removed.

In addition, in other embodiments, the dummy clk between the third access address RA2+CA2 and the written data RA1CA1_data for the second access may be alternatively set between the RA2+CA2 and the preceding written data RA0CA0_data, or be distributed between the RA2+CA2 and the preceding written data RA0CA0_data and between the RA2+CA2 and the subsequent written data RA1CA1_data.

In addition, similar to the aforementioned write operation example, as shown in FIG. 6, optionally, the host may send the DM signal on the DQS/DM line while transmitting each written data, thereby masking the written data as needed.

In addition, those skilled in the art may understand that the write command format in FIG. 6 is not intended to limit the solution of this disclosure. For example, there may be various variations of the write command format in FIG. 6, such as receiving more than two access addresses (e.g., RA0+CA0+RA1+CA1+RA2+CA2+ . . . ) in the initial stage, receiving a new access address after any selected written data instead of after each written data, or receiving more than one new access address continuously at one time. The various variations and combinations thereof are within the scope of the solution claimed in this disclosure.

In the examples of read/write operations given earlier, it is not necessary to preset the number of consecutive read/write operations, that is, any number of consecutive read/write operations can be performed. As long as the specific access mode that has been initiated has not been ended (that is, no high CE# has been received), the memory can constantly receive new access addresses and perform read/write operations based on them.

In addition, in other embodiments, as will be detailed in Embodiment 3 below, the random row access mode of the present disclosure may also include a mode, in which the number of consecutive read/write operations is preset, and after starting the mode, a predetermined number of access addresses are received in sequence, and then the corresponding read/written data for the received addresses is transmitted in sequence. Although this mode is discussed in Embodiment 3 as a specific example of the fixed-number random access mode, it can also be referred to as a specific example of the random row access mode; these two modes are divided from different perspectives, and it does not mean that they are completely different modes.

Embodiment 3: Fixed-Number Random Access Mode

Embodiment 3 of the present disclosure proposes a fixed-number random access mode, which means performing access (read/write) operations on a fixed number of access addresses (also known as fixed M-beat access addresses, where M>1).

In the aforementioned examples, the host needs to insert new column/row addresses that need to be accessed subsequently between pieces of read data/written data, and there is no limit on the total number of column/row addresses. Unlike this, in the fixed-number random access mode, during the waiting time of the initial latency, the M beats of addresses are sent, and no new access address is inserted during data input/output, without the need to switch between data and address. In some cases, it can further improve the throughput of the interface. Especially for read operations, the switching between data and address requires the host and PSRAM to continuously switch the direction of IO transmission, which increases design complexity and additional latency, while the fixed-number random access mode reduces the need for the above IO direction switching. In some embodiments, the host may determine the value of M by presetting a register (such as the mode register) in the memory, or specify the value of M by setting several bits in the command transmitted at the beginning.

Several examples of the fixed-number random access mode will be discussed below in details, taking sending 4 beats of addresses (M=4) in advance for example, in conjunction with the timing diagrams shown in the accompanying drawings, in which read operation example 1 and write operation example 1 correspond to the previous embodiment 1, and can also be considered as read/write examples of the random column access mode, while read operation example 2 and write operation example 2 correspond to the previous embodiment 2, and can also be considered as read/write examples of the random row access mode. Those skilled in the art understand that many of the details described below are provided merely for the sake of completeness of the solution, and are not intended to limit the technical solution of the present disclosure.

Read Operation Example 1

Figures 8, 9, 10:
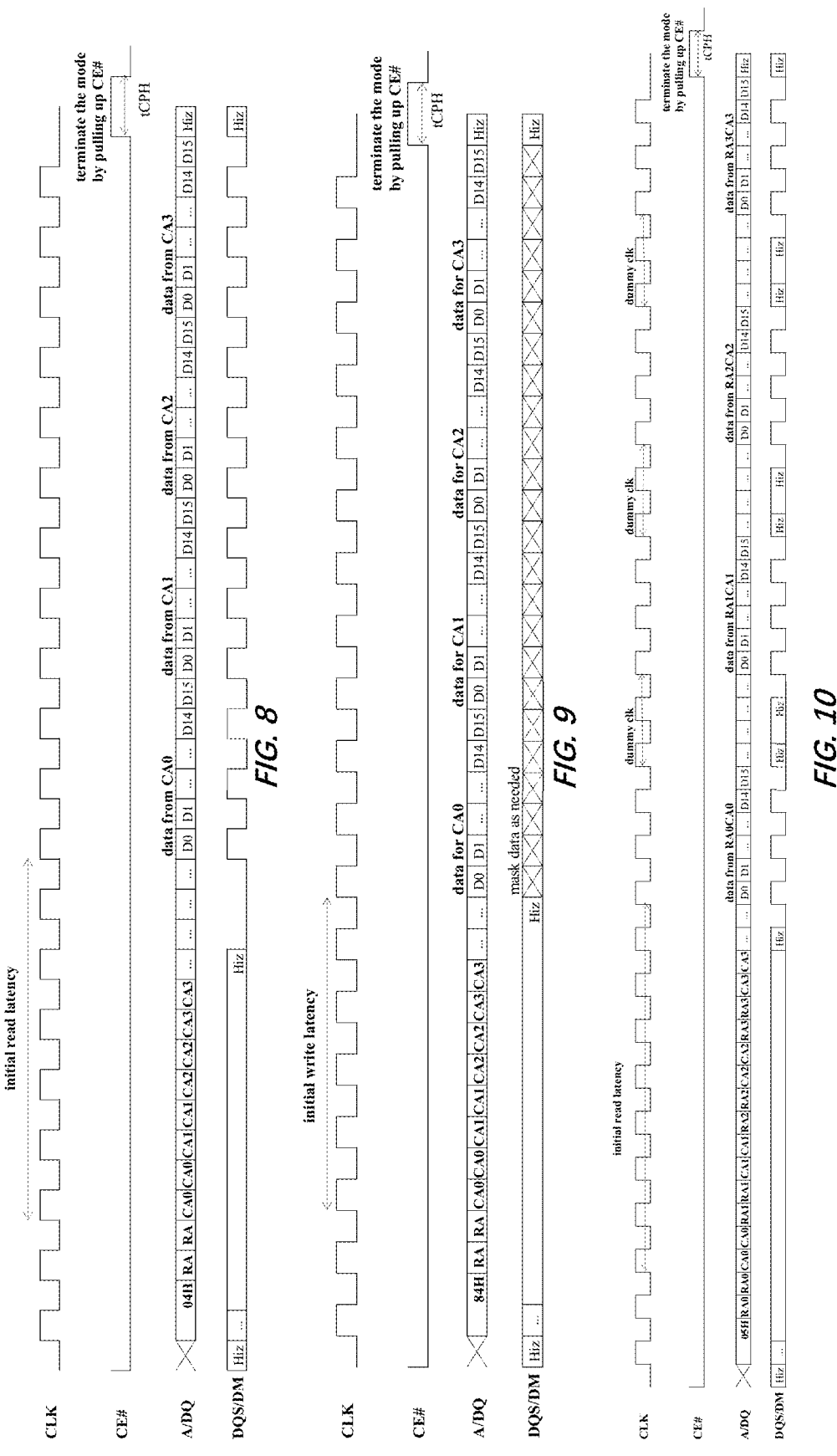
FIG. 8 illustrates a timing diagram of a read operation mode as an example of a fixed-number random access mode according to an embodiment of the present disclosure.
FIG. 9 illustrates a timing diagram of a write operation mode as an example of a fixed-number random access mode according to an embodiment of the present disclosure.
FIG. 10 illustrates a timing diagram of a read operation mode as an example of a fixed-number random access mode according to an embodiment of the present disclosure.

FIG. 8 illustrates a timing diagram of read operation mode example 1 of the fixed-number random access mode according to an embodiment of the present disclosure.

The read operation in FIG. 8 is similar to the read operation in FIG. 2 described previously, with the main difference being the order of address and data transmission and the number of read operations. Therefore, the following description will focus on the order of address and data transmission in FIG. 8, and details and variations of the remaining operations may refer to the relevant descriptions for FIG. 2 previously and will not be elaborated here.

As shown in FIG. 8, the host sends the clock signal CLK to the memory, pulls down the chip enable signal CE#, and sends a fixed-number random read command (in the embodiment of FIG. 8, the command is "04H") on the A/DQ lines, thereby initiating the fixed-number random access mode specified by the command.

After transmitting the command, the host then sends a common row address RA and four column addresses CA0-CA3 on the A/DQ lines. After waiting for a second preset number of dummy clock cycles (dummy clk) set similarly as the example shown in FIG. 2 mentioned earlier, the host starts receiving data from CA0; at this time, the burst length is set to 16 bytes, so 16 bytes of data D0-D15 are continuously output. Then, the host continues to receive data from CA1, data from CA2, and data from CA3. After finishing receiving the predetermined 4 pieces of read data, the host pulls up CE# to end the command mode. In this command mode, no new address is inserted between 2 pieces of data. In some cases, if the host does not need to read 4 pieces of data, for example, if the host only wants to perform 3 consecutive read operations, then CE# may be pulled up after finishing receiving data from CA2 to end the command mode in advance, or the value of M may be adjusted to 3 via a register or some bits of the command.

From the above content, it may be concluded that the read timing corresponding to the exemplary read command "04H" of the fixed-number random access mode represented by the timing diagram in FIG. 8 may be expressed as follows (it is worth noting that, as mentioned earlier, this disclosure does not limit the fixed-number random read mode to be initiated by the specific read command "04H", and in other embodiments, the fixed-number random read mode may also be initiated by presetting a specific mode register):

cmd+RA+CA0+ . . . +CAn+dummy clk+CA0_
    data+ . . . +CAn_data
  where, n is equal to the value of (M−1), "cmd" represents the command, "CA0" or the like represents the respective column address, "dummy clk" represents the required dummy clock cycles set based on the circuit implementation of the memory (mainly includes the IO switching clock cycles, the waiting time required for the read latency, etc.), which may also be removed in some cases, and "CA0_data" or the like represents the data read in response to its corresponding column address such as CA0. In addition, in some cases, it is also possible to add "dummy clk" between pieces of read data as needed.

In addition, those skilled in the art may understand that the read command format of FIG. 8 is not intended to limit the solution of this disclosure. For example, the read command format of FIG. 8 may also have various variations, such as changing the transmission order of addresses or data, or adding the "dummy clk" at any appropriate position as needed. The above variations and combinations thereof are within the scope of the claimed solution of the present disclosure.

Write Operation Example 1

FIG. 9 illustrates a timing diagram of write operation mode example 1 of the fixed-number random access mode according to an embodiment of the present disclosure.

The write operation in FIG. 9 is similar to the write operation in FIG. 4 described above, with the main difference being the order of address and data transmission and the number of write operations. Therefore, the following description will focus on the order of address and data transmission in FIG. 9, and details and variations of the remaining operations may refer to the relevant descriptions for FIG. 4 previously and will not be elaborated here.

As shown in FIG. 9, the host sends the clock signal CLK to the memory, pulls down the chip enable signal CE#, and sends a fixed-number random write command on the A/DQ lines (in the embodiment of FIG. 9, the command is "84H"), thereby initiating the fixed-number random access mode specified by the command.

After transmitting the command, the host then sends a common row address RA and four column addresses CA0-CA3 on the A/DQ lines. After waiting for a second preset number of dummy clock cycles (dummy clk) set similarly as the example shown in FIG. 4 mentioned earlier, the host starts sending data for CA0; at this time, the burst length is set to 16 bytes, so 16 bytes of data D0-D15 are continuously sent. Then, the host continues to send data for CA1, data for CA2, and data for CA3. After finishing sending the scheduled 4 pieces of written data, the host pulls up CE# to end the command mode. In some cases, if the host does not need to write 4 pieces of data, for example, if the host only wants to perform 3 consecutive write operations, then CE# may be pulled up after finishing sending the data for CA2 to end the command mode in advance, or the value of M may be adjusted to 3 via a register or some bits of the command. In some cases, when CE# is pulled up in advance, the current written data has not been completely transmitted, so similar to the previous example, the remainder of the written data whose number of bits does not reach the 2 to the power of N may be discarded and not be written to the memory array.

From the above content, it may be concluded that the write timing corresponding to the exemplary write command "84H" of the fixed-number random access mode represented by the timing diagram in FIG. 9 may be expressed as follows (it is worth noting that, as mentioned earlier, this disclosure does not limit the fixed-number random write mode to be initiated by the specific write command "84H", and in other embodiments, the fixed-number random write mode may also be initiated by presetting a specific mode register):

cmd+RA+CA0+ . . . +CAn+dummy clk+CA0_data+ . . .
    +CAn_data
  where n is equal to the value of (M−1), "cmd" represents the command, "CA0" or the like represents the respective column address, "dummy clk" represents the required dummy clock cycles set based on the circuit implementation of the memory, which may also be removed in some cases, and "CA0_data" or the like represents the data to be written in response to its corresponding column address such as CA0. In addition, in some cases, it is also possible to add "dummy clk" between pieces of written data as needed.

In addition, those skilled in the art may understand that the write command format of FIG. 9 is not intended to limit the solution of this disclosure. For example, the write command format of FIG. 9 may also have various variations, such as changing the transmission order of addresses or data, or adding the "dummy clk" at any appropriate position as needed. The above variations and combinations thereof are within the scope of the claimed solution of the present disclosure.

Read Operation Example 2

FIG. 10 illustrates a timing diagram of read operation mode example 2 of the fixed-number random access mode according to an embodiment of the present disclosure.

The read operation in FIG. 10 is similar to the read operation in FIG. 5 described previously, with the main difference being the order of address and data transmission and the number of read operations. Therefore, the following will mainly describe the order of address and data transmission in FIG. 10, and details and variations of the remaining operations may refer to the relevant descriptions for FIG. 5 previously and will not be elaborated here.

As shown in FIG. 10, the host sends the clock signal CLK to the memory, pulls down the chip enable signal CE#, and sends a fixed-number random read command (in the embodiment of FIG. 10, the command is "05H") on the A/DQ lines, thereby initiating the fixed-number random access mode specified by the command.

After transmitting the command, the host then sends four access addresses RA0+CA0, RA1+CA1, RA2+CA2, and RA3+CA3 on the A/DQ lines. Then, after waiting for a second preset number of dummy clock cycles (dummy clk) set similarly as the example shown in FIG. 5 mentioned earlier, the host starts receiving data from RA0CA0; at this time, the burst length is set to 16 bytes, so 16 bytes of data D0-D15 are output continuously. Then, after waiting for a fourth preset number of dummy clock cycles (dummy clk), the host continues to receive data from RA1CA1, data from RA2CA2, and data from RA3CA3, where it waits for the fourth preset number of dummy clock cycles (dummy clk) between every two pieces of read data. In some embodiments, the fourth preset number may be preset in the mode register based on the time required to complete the word line switching process and the frequency of the clock cycle. After finishing receiving the predetermined 4 pieces of read data, the host pulls up CE# to end the command mode. In this command mode, no new address is inserted between 2 pieces of data. In some cases, if the host does not need to read 4 pieces of data, for example, if the host only wants to perform 3 consecutive read operations, CE# may be pulled up after finishing receiving the data from RA2CA2 to end the command mode in advance, or the value of M may be adjusted to 3 through a register or some bits of the command.

From the above content, it may be concluded that the read timing corresponding to the exemplary read command "05H" of the fixed-number random access mode represented by the timing diagram in FIG. 10 may be expressed as follows (it is worth noting that, as mentioned earlier, this disclosure does not limit the fixed-number random read mode to be initiated by the specific read command "05H", and in other embodiments, the fixed-number random read mode may also be initiated by presetting a specific mode register):

cmd+RA0+CA0+ . . . +RAn+CAn+dummy clk+
        RA0CA0_data+dummy clk+ . . . +RAnCAn_data where, n is equal to the value of (M−1), "cmd" represents the command, "RA0" or the like represents the respective row address, "CA0" or the like represents the respective column address, "dummy clk" represents the required dummy clock cycles set based on the circuit implementation of the memory (mainly includes the IO switching clock cycles, the waiting time required for the read latency, etc.), which may also be removed in some cases, and "RA0CA0_data" or the like represents the data read in response to its corresponding access address such as RA0+CA0. Those skilled in the art may understand that, as mentioned earlier, the numbers of clock cycles for the respective dummy clks in this read timing may be the second preset number, or the fourth preset number, and may be the same or different from each other.

Similar to the previous example, due to the pre-stored access address (e.g. RA1CA1) for the subsequent read operation, some stages of two consecutive read operations can be performed in parallel. For example, the outputting process of the data from the preceding read operation via the A/DQ lines and the word line switching process required for the subsequent read operation can be performed at least partially in parallel, thereby reducing the time for consecutive read operations and improving access speed. In one embodiment, the word line switching process for the subsequent read operation is initiated before the output of the data in response to the preceding read operation via the A/DQ lines is complete, and the word line switching process includes: deactivating the word line (e.g. WL0) corresponding to the row address (e.g. RA0) of the preceding read operation and activating the word line (e.g. WL1) corresponding to the row address (e.g. RA1) of the subsequent read operation.

In addition, those skilled in the art may understand that the read command format of FIG. 10 is not intended to limit the solution of this disclosure. For example, the read command format of FIG. 10 may also have various variations, such as changing the transmission order of addresses or data, or adding the "dummy clk" at any appropriate position as needed. The above variations and combinations thereof are within the scope of the claimed solution of the present disclosure.

Write Operation Example 2

Figures 11, 12:
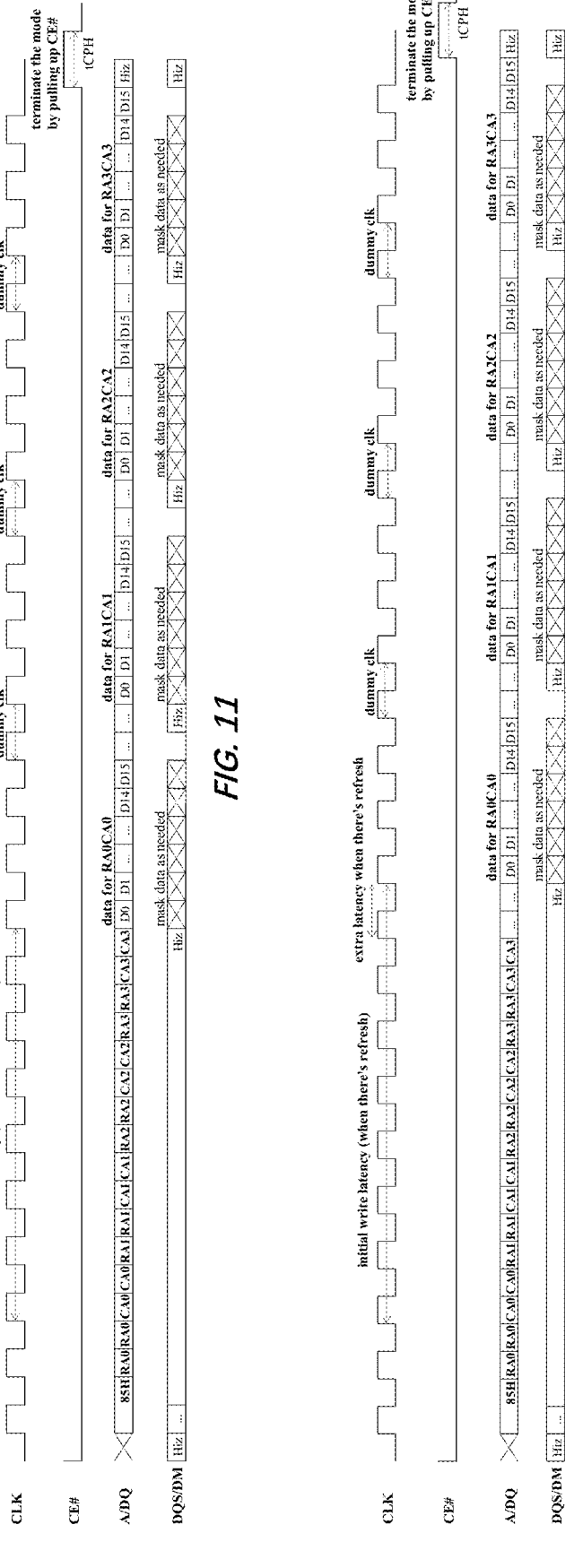
FIGS. 11 and 12 illustrate timing diagrams for two cases of a write operation mode as an example of a fixed-number random access mode according to an embodiment of the present disclosure.

FIGS. 11 and 12 illustrate timing diagrams of two cases of write operation mode example 2 of the fixed-number random access mode according to an embodiment of the present disclosure.

The write operations in FIG. 11 and FIG. 12 are similar to the write operations in FIG. 6 and FIG. 7 described previously, with the main difference being the order of address and data transmission and the number of write operations. Similarly, the difference between FIG. 11 and FIG. 12 is only that the write operation need to wait for additional latency when encountering refresh operation. Therefore, the following will mainly describe the order of address and data transmission in FIG. 12, and the details and variations of the remaining operations can be referred to the relevant descriptions in FIG. 6 and FIG. 7 previously, which will not be repeated here.

As shown in FIG. 12, the host sends the clock signal CLK to the memory, pulls down the chip enable signal CE#, and sends a fixed-number random write command (in the embodiment of FIG. 12, the command is "85H") on the A/DQ lines, thereby initiating the fixed-number random access mode specified by the command.

After transmitting the command, the host then sends four access addresses RA0+CA0, RA1+CA1, RA2+CA2, and RA3+CA3 on the A/DQ lines. After waiting for a second preset number of dummy clock cycles (dummy clk) set similarly as the example shown in FIG. 6 mentioned earlier, the host starts to send data for RA0CA0; at this time, the burst length is set to 16 bytes, so 16 bytes of data D0-D15 are consecutively sent. Then, after waiting for a fourth preset number of dummy clock cycles (dummy clk), the host continues to send data for RA1CA1, data for RA2CA2, and data for RA3CA3, where it waits for the fourth preset number of dummy clock cycles (dummy clk) between every two pieces of written data. In some embodiments, the fourth preset number may be preset in the mode register based on the time required to complete the word line switching process and/or the time required for refresh operation, as well as the frequency of the clock cycle. After the transmission of the predetermined 4 pieces of written data is completed, the host pulls up CE# to end the command mode. In some cases, if the host does not need to write 4 pieces of data, for example, if the host only wants to perform 3 consecutive write operations, CE# may be pulled up after finishing sending the data for RA2CA2 to end the command mode in advance, or the value of M may be adjusted to 3 through a register or some bits of the command. In some cases, when CE# is pulled up in advance, the current written data has not been transmitted completely, so similar to the previous example, the remainder of the written data whose number of bits does not reach the 2 to the power of N may be discarded and not be written to the memory array.

From the above content, it may be concluded that the write timing corresponding to the exemplary write command "85H" of the fixed-number random access mode represented by the timing diagram in FIG. 12 may be expressed as follows (it is worth noting that, as mentioned earlier, this disclosure does not limit the fixed-number random write mode to be initiated by the specific write command "85H", and in other embodiments, the fixed-number random write mode may also be initiated by presetting a specific mode register):

cmd+RA0+CA0+ . . . +RAn+CAn+dummy clk+
RA0CA0_data+dummy clk+ . . . +RAnCAn_data
where n is equal to the value of (M−1), "cmd" represents the command, "RA0" or the like represents the respective row address, "CA0" or the like represents the respective column address, "dummy clk" represents the required dummy clock cycles set based on the circuit implementation of the memory, which may also be removed in some cases, and "RA0CA0_data" or the like represents the data to be written in response to its corresponding access address such as RA0+CA0. Those skilled in the art may understand that, as mentioned earlier, the numbers of clock cycles for the respective dummy clks in this timing may be the second preset number, or the fourth preset number, and may be the same or different from each other. In addition, whether to set the dummy clk and the required number of the dummy clks are related to the specific design of the memory.

Similar to the previous example, due to the pre-stored access address (e.g., RA1CA1) for the subsequent write operation, some stages of the two consecutive write operations can be performed in parallel, thereby reducing the time for consecutive write operations and improving access speed. In one embodiment, before finishing receiving the data RA1CA1_data in response to the subsequent write operation via the A/DQ lines, the word line switching process for the subsequent write operation is initiated. The word line switching process includes deactivating the word line (e.g., WL0) corresponding to the row address (e.g., RA0) of the preceding write operation and activating the word line (e.g., WL1) corresponding to the row address (e.g., RA1) of the subsequent write operation. In other embodiments, since multiple addresses such as RA0CA0, RA1CA1, etc. for multiple write operations have been pre-stored in the address latch 150 in advance, if the number of data latches/registries 160 is sufficient, the receiving process of data RA1CA1_data for the subsequent write operation can even be performed partially in parallel with the word line switching process required for the preceding write operation for RA0CA0.

In addition, those skilled in the art may understand that the write command format of FIG. 12 is not intended to limit the solution of this disclosure. For example, the write command format of FIG. 12 may also have various variations, such as changing the transmission order of addresses or data, or adding the "dummy clk" at any appropriate position as needed. The above variations and combinations thereof are within the scope of the claimed solution of the present disclosure.

In addition, in the above embodiments/examples, the number of each "dummy clk" may be changed according to the operating frequency. For example, the host may determine the number of each "dummy clk" according to the clock cycle (i.e., operating frequency) of the clock CLK synchronized with the PSRAM, and then set the determined number in advance in a register (such as the mode register).

In addition, various setting operations for the register (such as the mode register) in the memory as mentioned in the above embodiments/examples (such as starting a specified access mode, setting the burst length for each access operation or a default burst length, setting the number of access addresses in the fixed-number random access mode, setting the number of IO switching clock cycles or the number of dummy clock cycles, etc.) may be performed uniformly. For example, a write operation to the mode register is performed in advance, so that the code data corresponding to various settings is written to the corresponding mode register.

Below are a few examples to illustrate.

In some possible implementations, a memory comprises a memory array and an access interface for external access to the memory array, the access interface comprises at least one data/address multiplexing line for transmitting data and address, and a method for operating the memory comprises: starting a specified random column access mode, in which the memory array can be continuously read or written in response to receiving multiple access addresses, wherein the multiple access addresses have a same row address and random column addresses; receiving a common row address and at least one column address via the data/address multiplexing line; outputting data read in response to the received access address via the data/address multiplexing line in the case where the specified random column access mode indicates a read operation, or receiving data to be written in response to the received access address via the data/address multiplexing line in the case where the specified random column access mode indicates a write operation; and ending the random column access mode by receiving an invalid chip enable signal.

Optionally, the method further comprises: before ending the random column access mode, and after outputting or receiving data read or to be written in response to any previously received access address via the data/address multiplexing line, receiving one or more new column addresses via the data/address multiplexing line, and performing the read operation or write operation in response to the received new column addresses, wherein the total number of received column addresses is not limited.

Optionally, in the case where the specified random column access mode indicates the read operation: a new column address is received between two pieces of data sequentially read and outputted respectively in response to two previously received access addresses.

Optionally, in the case where the specified random column access mode indicates the write operation: a new column address is received each time after receiving data to be written in response to a previously received access address.

Optionally, after finishing outputting the piece of data read in response to one of the previously received access addresses, it waits for a first preset number of clock cycles before receiving the new column address, wherein the first preset number is preset in a mode register according to a time required for direction switching on the data/address multiplexing line and a frequency of the clock cycles.

Optionally, the method further comprises: presetting a number of the access addresses to be read/written in the random column access mode; after starting the random column access mode, sequentially receiving the common row address and the preset number of column addresses in succession; and in the case where the specified random column access mode indicates the read operation, sequentially outputting data read respectively in response to each of the received access addresses in succession, or in the case where the specified random column access mode indicates the write operation, sequentially receiving data to be written respectively in response to each of the received access addresses in succession.

Optionally, during the period from the beginning of the first read/write operation to the end of the last read/write operation, a word line of the memory array corresponding to the received common row address remains activated.

Optionally, it waits for a second preset number of clock cycles preset according to a frequency of the clock cycles, after finishing receiving the column address and before outputting or receiving the data read or to be written.

Optionally, the timing for receiving the new column addresses is determined by a preset data amount for the previous read/write operation or a number of clock cycles required for the previous read/write operation, or determined by implementing handshake with a host via another transmission line included in the access interface.

Optionally, after outputting data read in response to any previously received access address and before receiving the new column addresses, it waits for at least a first preset number of clock cycles, which is preset according to a frequency of the clock cycles, to switch data transmission direction of the data/address multiplexing line, and during the first preset number of clock cycles the data/address multiplexing line is released to a high-impedance state.

Optionally, in the case of receiving the invalid chip enable signal when the read/write operation performed in response to the received column address is not completed, the column address whose corresponding read operation has not yet been started or the column address whose corresponding written data has not yet been received any is discarded, and part of the written data is discarded in the case that the write operation is in progress or the written data is being received, wherein the chip enable signal is received from a host via a chip enable line included in the access interface.

Optionally, the access interface further includes a transmission line, for outputting a signal for synchronizing sampling of the data output on the data/address multiplexing line in the case of the read operation, and for receiving a signal for masking the data received on the data/address multiplexing line in the case of the write operation.

Optionally, the memory is a PSRAM or a Flash.

Optionally, the access interface adopts a SPI protocol.

Optionally, the number of the data/address multiplexing line is $2^N$, and $2^N$ or $2^{N+1}$ bits of data or address are output or received per clock cycle via the data/address multiplexing line, wherein N is a non-negative integer.

Optionally, the amount of data read or to be written in response to each access address is equal to a burst length*8 bits, wherein the burst length is preset in a mode register.

Optionally, the specified random column access mode is started by receiving a predetermined command via the data/address multiplexing line, or started by a preset mode register.

Optionally, the order of the read or written data transmitted via the data/address multiplexing line is consistent with the order of the received addresses.

In some possible implementations, a memory comprises a memory array and an access interface for external access to the memory array, the access interface comprises at least one data/address multiplexing line for transmitting data and address, and a method for operating the memory comprises: starting a specified random row access mode, in which the memory array can be continuously read or written in response to receiving multiple access addresses, wherein the multiple access addresses have random row addresses and random column addresses; receiving at least two access addresses via the data/address multiplexing line, wherein each of the access addresses includes a row address and a column address; outputting data read in response to the received access addresses via the data/address multiplexing line in the case where the specified random row access mode indicates a read operation, or receiving data to be written in response to the received access addresses via the data/address multiplexing line in the case where the specified random row access mode indicates a write operation; and ending the random row access mode by receiving an invalid chip enable signal.

Optionally, the method further comprises: before ending the random row access mode, and after outputting or receiving data read or to be written in response to any previously received access address via the data/address multiplexing line, receiving one or more new access addresses via the data/address multiplexing line, and performing the read operation or write operation in response to the received new access addresses, wherein the total number of received access addresses is not limited.

Optionally, a new access address is received between two pieces of data sequentially read and outputted respectively in response to two previously received access addresses, or between two pieces of data to be written sequentially received respectively in response to two previously received access addresses.

Optionally, after finishing outputting the piece of data read in response to a first access address of the two previously received access addresses, it waits for a first preset number of clock cycles before receiving the new access address, or the new access address is received after finishing receiving the data to be written in response to a first access address of the two previously received access addresses.

Optionally, after finishing receiving the new access address, it waits for a third preset number of clock cycles before starting to output data read in response to a second access address of the two previously received access addresses; or after finishing receiving the new access address, it starts to receive data to be written in response to a second access address of the two previously received access addresses.

Optionally, in the case where the specified random row access mode indicates the read operation, the data/address multiplexing line is released to a high-resistance state during the first preset number of clock cycles and the third preset number of clock cycles; wherein the first preset number is preset in a mode register according to a time required for direction switching on the data/address multiplexing line and a frequency of the clock cycles; wherein the third preset number is preset in the mode register according to a time required for deactivating a word line corresponding to the first access address and activating a word line corresponding to the second access address, and the frequency of the clock cycles; wherein the operation of deactivating the word line corresponding to the first access address and activating the word line corresponding to the second access address is initiated before the outputting of the data read in response to the previously received first access address is completed.

Optionally, the method further comprises: presetting a number of the access addresses to be read/written in the random row access mode; after starting the random row access mode, sequentially receiving the preset number of access addresses in succession; and in the case where the specified random row access mode indicates the read operation, sequentially outputting data read respectively in response to each of the received access addresses in succession, or in the case where the specified random row access mode indicates the write operation, sequentially receiving data to be written respectively in response to each of the received access addresses in succession.

Optionally, outputting data for a preceding read operation via the data/address multiplexing line is performed at least partially in parallel with switching to a word line required for a subsequent read operation; or switching to a word line required for a subsequent write operation is initiated, before the receiving of data in response to a subsequent write operation via the data/address multiplexing line is completed.

In some possible implementations, a memory comprises: a memory array; an access interface for external access to the memory array, the access interface comprising at least one data/address multiplexing line for transmitting data and address; and a control component configured to control the memory to perform the method as defined in the above-mentioned some possible implementations.

In addition, unless it is obviously contradictory, the various details or variations mentioned in the above embodiments/examples can be combined with other embodiments/examples.

As mentioned above, the present disclosure can select a different command (such as 03H, 83H, 02H, 82H, 04H, 84H, 05H, 85H, etc.) to start an appropriate random access mode according to different access requirements, thereby more appropriately improving the access speed (for example, based on the characteristics of random column access, the present disclosure can further improve the access speed by not switching WL).

As mentioned earlier, each of the new solutions in this disclosure can improve the access speed for multiple random addresses. In some cases, at the same interface frequency, the data throughput rate of the new solutions in this disclosure can be increased by more than 50% compared to traditional PSRAM, and no additional pins (i.e., transmission lines in the interface) are required. In some cases, the new solutions in this disclosure can support any different number of addresses and data required by the host.

Various embodiments of the present disclosure have been described above, and the foregoing descriptions are exemplary, not exhaustive, and not limiting of the disclosed embodiments. Numerous modifications and variations will be apparent to those of ordinary skill in the art without departing from the scope and spirit of the described embodiments. The terminology used herein was chosen to best explain the principles of the various embodiments, the practical application or improvement over the technology in the marketplace, or to enable others of ordinary skill in the art to understand the various embodiments disclosed herein.

What is claimed is:

1. A method for operating a memory, the memory comprising a memory array and an access interface for external access to the memory array, the access interface comprising at least one data/address multiplexing line for transmitting data and address, and the access interface adopting a SPI protocol;
the method comprising:
starting a specified column access mode, in which the memory array can be continuously read or written in response to receiving multiple access addresses, wherein the multiple access addresses have a same row address and multiple column addresses;
receiving a row address and at least one column address via the data/address multiplexing line;
outputting data read in response to the received access address via the data/address multiplexing line in the case where the specified column access mode indicates a read operation, or receiving data to be written in response to the received access address via the data/address multiplexing line in the case where the specified column access mode indicates a write operation; and
ending the column access mode by receiving an invalid chip enable signal;
wherein the amount of data read or to be written in response to each access address is equal to a burst length*8 bits, wherein the burst length is preset in a mode register; and/or
the specified column access mode is started by receiving a predetermined command via the data/address multiplexing line, or started by a preset mode register.

2. The method according to claim 1, further comprising:
before ending the column access mode, and after outputting or receiving data read or to be written in response to any previously received access address via the data/address multiplexing line, receiving one or more new column addresses via the data/address multiplexing line, and performing the read operation or write operation in response to the received new column addresses, wherein the total number of received column addresses is not limited.

3. The method according to claim 2, wherein,
in the case where the specified column access mode indicates the read operation:
a new column address is received between two pieces of data sequentially read and outputted respectively in response to two previously received access addresses; or, in the case where the specified column access mode indicates the write operation:

a new column address is received each time after receiving data to be written in response to a previously received access address.

4. The method according to claim 3, wherein, after finishing outputting a piece of data read in response to one of the previously received access addresses, it waits for a first preset number of clock cycles before receiving the new column address, wherein the first preset number is preset in a mode register according to a time required for direction switching on the data/address multiplexing line and a frequency of the clock cycles.

5. The method according to claim 1, further comprising:

presetting a number of the access addresses to be read/written in the column access mode;

after starting the column access mode, sequentially receiving the row address and the preset number of column addresses in succession; and in the case where the specified column access mode indicates the read operation, sequentially outputting data read respectively in response to each of the received access addresses in succession, or in the case where the specified column access mode indicates the write operation, sequentially receiving data to be written respectively in response to each of the received access addresses in succession.

6. The method according to claim 1, wherein, during the period from the beginning of the first read/write operation to the end of the last read/write operation, a word line of the memory array corresponding to the received row address remains activated.

7. The method according to claim 1, wherein, it waits for a second preset number of clock cycles preset according to a frequency of the clock cycles, after finishing receiving the column address and before outputting or receiving the data read or to be written.

8. A method for operating a memory, the memory comprising a memory array and an access interface for external access to the memory array, the access interface comprising at least one data/address multiplexing line for transmitting data and address, and the access interface adopting a SPI protocol;

the method comprising:

starting a specified column access mode, in which the memory array can be continuously read or written in response to receiving multiple access addresses, wherein the multiple access addresses have a same row address and multiple column addresses;

receiving a row address and at least one column address via the data/address multiplexing line;

outputting data read in response to the received access address via the data/address multiplexing line in the case where the specified column access mode indicates a read operation, or receiving data to be written in response to the received access address via the data/address multiplexing line in the case where the specified column access mode indicates a write operation; and ending the column access mode by receiving an invalid chip enable signal;

before ending the column access mode, and after outputting or receiving data read or to be written in response to any previously received access address via the data/address multiplexing line, receiving one or more new column addresses via the data/address multiplexing line, and performing the read operation or write operation in response to the received new column addresses, wherein the total number of received column addresses is not limited;

wherein, the timing for receiving the new column addresses is determined by a preset data amount for the previous read/write operation or a number of clock cycles required for the previous read/write operation, or determined by implementing handshake with a host via another transmission line included in the access interface.

9. The method according to claim 2, wherein, after outputting data read in response to any previously received access address and before receiving the new column addresses, it waits for at least a first preset number of clock cycles, which is preset according to a frequency of the clock cycles, to switch data transmission direction of the data/address multiplexing line, and during the first preset number of clock cycles the data/address multiplexing line is released to a high-impedance state.

10. The method according to claim 1, wherein, in the case of receiving the invalid chip enable signal when a read/write operation performed in response to the received column address is not completed, the column address whose corresponding read operation has not yet been started or the column address whose corresponding written data has not yet been received any is discarded, and part of the written data is discarded in the case that the write operation is in progress or the written data is being received, wherein the chip enable signal is received from a host via a chip enable line included in the access interface.

11. The method according to claim 1, wherein, the access interface further includes a transmission line, for outputting a signal for synchronizing sampling of the data output on the data/address multiplexing line in the case of the read operation, and for receiving a signal for masking the data received on the data/address multiplexing line in the case of the write operation; and/or the memory is a PSRAM or a Flash; and/or the number of the data/address multiplexing line is $2^N$, and $2^N$ or $2^{N+1}$ bits of data or address are output or received per clock cycle via the data/address multiplexing line, wherein N is a non-negative integer; and/or the order of the read or written data transmitted via the data/address multiplexing line is consistent with the order of the received addresses.

12. A method for operating a memory, the memory comprising a memory array and an access interface for external access to the memory array, the access interface comprising at least one data/address multiplexing line for transmitting data and address, and the access interface adopts a SPI protocol;

the method comprises:

starting a specified row access mode, in which the memory array can be continuously read or written in response to receiving multiple access addresses, wherein the multiple access addresses have multiple row addresses and multiple column addresses;

receiving at least two access addresses via the data/address multiplexing line, wherein each of the access addresses includes a row address and a column address;

outputting data read in response to the received access addresses via the data/address multiplexing line in the case where the specified row access mode indicates a read operation, or receiving data to be written in response to the received access addresses via the data/address multiplexing line in the case where the specified row access mode indicates a write operation; and ending the row access mode by receiving an invalid chip enable signal;

the amount of data read or to be written in response to each access address is equal to a burst length*8 bits, wherein the burst length is preset in a mode register; and/or the specified row access mode is started by receiving a predetermined command via the data/address multiplexing line, or started by a preset mode register.

13. The method according to claim 12, further comprising:

before ending the row access mode, and after outputting or receiving data read or to be written in response to any previously received access address via the data/address multiplexing line, receiving one or more new access addresses via the data/address multiplexing line, and performing the read operation or write operation in response to the received new access addresses, wherein the total number of received access addresses is not limited.

14. The method according to claim 13, wherein, a new access address is received between two pieces of data sequentially read and outputted respectively in response to two previously received access addresses, or between two pieces of data to be written sequentially received respectively in response to two previously received access addresses.

15. The method according to claim 14, wherein, after finishing outputting the piece of data read in response to a first access address of the two previously received access addresses, it waits for a first preset number of clock cycles before receiving the new access address, or the new access address is received after finishing receiving the data to be written in response to a first access address of the two previously received access addresses.

16. The method according to claim 15, wherein, after finishing receiving the new access address, it waits for a third preset number of clock cycles before starting to output data read in response to a second access address of the two previously received access addresses, or after finishing receiving the new access address, it starts to receive data to be written in response to a second access address of the two previously received access addresses.

17. The method according to claim 16, wherein, in the case where the specified row access mode indicates the read operation, the data/address multiplexing line is released to a high-resistance state during the first preset number of clock cycles and the third preset number of clock cycles;

wherein the first preset number is preset in a mode register according to a time required for direction switching on the data/address multiplexing line and a frequency of the clock cycles;

wherein the third preset number is preset in the mode register according to a time required for deactivating a word line corresponding to the first access address and activating a word line corresponding to the second access address, and the frequency of the clock cycles;

wherein the operation of deactivating the word line corresponding to the first access address and activating the word line corresponding to the second access address is initiated before the outputting of the data read in response to the previously received first access address is completed.

18. The method according to claim 12, further comprising:

presetting a number of the access addresses to be read/written in the row access mode;

after starting the row access mode, sequentially receiving the preset number of access addresses in succession; and in the case where the specified row access mode indicates the read operation, sequentially outputting data read respectively in response to each of the received access addresses in succession, or in the case where the specified row access mode indicates the write operation, sequentially receiving data to be written respectively in response to each of the received access addresses in succession.

19. The method according to claim 12, wherein, outputting data for a preceding read operation via the data/address multiplexing line is performed at least partially in parallel with switching to a word line required for a subsequent read operation; or switching to a word line required for a subsequent write operation is initiated, before the receiving of data in response to a subsequent write operation via the data/address multiplexing line is completed.

20. A memory comprising:

a memory array;

an access interface for external access to the memory array, the access interface comprising at least one data/address multiplexing line for transmitting data and address; and a controller configured to control the memory to perform the method according to claim 1.

* * * * *